United States Patent
Khang et al.

(10) Patent No.: US 10,624,205 B2
(45) Date of Patent: Apr. 14, 2020

(54) METALLIC NANO STRUCTURE, METHOD OF FABRICATING THE SAME, AND ELECTRICAL APPARATUS HAVING THE SAME

(71) Applicant: UNIVERSITY-INDUSTRY FOUNDATION (UIF), YONSEI UNIVERSITY, Seoul (KR)

(72) Inventors: Dahl-Young Khang, Seoul (KR); Sung-Soo Yoon, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/966,223

(22) Filed: Apr. 30, 2018

(65) Prior Publication Data
US 2018/0324947 A1 Nov. 8, 2018

(30) Foreign Application Priority Data
May 8, 2017 (KR) .................. 10-2017-0057608

(51) Int. Cl.
| | |
|---|---|
| H05K 1/00 | (2006.01) |
| H05K 1/02 | (2006.01) |
| G02B 6/10 | (2006.01) |
| H05K 3/38 | (2006.01) |
| B82Y 30/00 | (2011.01) |

(Continued)

(52) U.S. Cl.
CPC ........... *H05K 1/0296* (2013.01); *G02B 6/107* (2013.01); *H05K 1/0212* (2013.01); *H05K 3/382* (2013.01); *B23K 28/00* (2013.01); *B82Y 30/00* (2013.01); *B82Y 40/00* (2013.01); *C22C 2200/04* (2013.01); *H05K 1/097* (2013.01); *H05K 2201/026* (2013.01); *H05K 2201/0257* (2013.01); *H05K 2201/0338* (2013.01); *H05K 2201/09054* (2013.01); *H05K 2203/0307* (2013.01); *H05K 2203/1131* (2013.01)

(58) Field of Classification Search
CPC ................. H05K 1/0296; H05K 3/382; H05K 2201/0338; H05K 2201/09054; H05K 2203/0307; H05K 1/0212; H05K 1/097; H05K 2201/0257; H05K 2201/026; H05K 2203/1131; G02B 6/107; B23K 28/00; B82Y 30/00; B82Y 40/00; C22C 2200/04
See application file for complete search history.

(56) References Cited

U.S. PATENT DOCUMENTS

| | | | | |
|---|---|---|---|---|
| 8,137,759 B2* | 3/2012 | Zhang | ............ | H01F 1/0054 427/457 |
| 9,969,893 B2* | 5/2018 | Kim | .................. | C09D 5/24 |

(Continued)

FOREIGN PATENT DOCUMENTS

KR 10-2016-0010406 1/2016

OTHER PUBLICATIONS

Office Action dated Feb. 11, 2019 corresponding to Korean Application No. 10-2017-0057608, 6 pages.

*Primary Examiner* — Pete T Lee

(57) ABSTRACT

The present invention relates to a metallic nano structure including a plurality of metallic nano materials; and a junction locally disposed in a region where the metallic nano materials adjacent to each other among the plurality of metallic nano materials are in contact with each other in order to bond the adjacent metallic nano materials.

16 Claims, 19 Drawing Sheets

(51) Int. Cl.
    *B23K 28/00*      (2006.01)
    *B82Y 40/00*      (2011.01)
    *H05K 1/09*      (2006.01)

(56) References Cited

U.S. PATENT DOCUMENTS

| | | | |
|---|---|---|---|
| 2011/0089160 A1* | 4/2011 | Kuriki | H05B 3/84 |
| | | | 219/553 |
| 2012/0164470 A1* | 6/2012 | Leschkies | B82Y 40/00 |
| | | | 428/607 |
| 2013/0342221 A1* | 12/2013 | Virkar | C09D 11/037 |
| | | | 324/661 |
| 2014/0238833 A1 | 8/2014 | Virkar et al. | |
| 2014/0374146 A1* | 12/2014 | Saito | B82Y 30/00 |
| | | | 174/251 |
| 2015/0016070 A1* | 1/2015 | Chang | H05K 1/0296 |
| | | | 361/748 |
| 2016/0198571 A1* | 7/2016 | Park | H05K 1/092 |
| | | | 174/251 |

\* cited by examiner

"J1" VIEW

METALLIC NANO STRUCTURE, METHOD OF FABRICATING THE SAME, AND ELECTRICAL APPARATUS HAVING THE SAME

CROSS-REFERENCE TO RELATED APPLICATION

This application claims priority of Korean Patent Application No. 10-2017-0057608, filed on May 8, 2017, in the KIPO (Korean Intellectual Property Office), the disclosure of which is incorporated herein entirely by reference.

BACKGROUND OF THE INVENTION

Field of the Invention

The present invention relates to a metal material, and more particularly, a metallic nano structure, a method of fabricating the same, and an electrical apparatus having the same.

Description of the Related Art

In connection with the practical applications of metallic nano structures including metallic nano materials such as metallic nano particles, metallic nano wires, metallic nano patterns, or metallic nano blocks, very tight and strong mechanical coupling between the metallic nano materials may be required. To this end, generally, a high-temperature heating method for heating the metallic nano material to a high temperature and then coupling the material or a plasmonic heating phenomenon inherently appeared in the metallic nano structure is being used.

However, in the high-temperature heating method, there is a limit that a substrate on which the metallic nano structure is disposed is exposed to a high temperature, so that a low-temperature processing material such as a plastic may not be applied to the substrate. Further, in the case where the metallic nano material is not a single layer but a multi-layer structure, there exists a very difficult problem that a welding process or a sintering process may not be applied for the underlying layer excluding the outermost layer due to the shadow effect because the method using the plasmonic heating phenomenon is a laser beam irradiation. Further, in the case of an electrical device using a substrate of a low-temperature processing material such as a flexible electrical device, there is a problem that a very tight and strong coupling between the metal nano material may not be obtained and accordingly, a reliable metallic nano structure and an electrical device may not be provided.

SUMMARY OF THE INVENTION

The object of the present invention is to provide a metallic nano structure having a very tight and strong coupling between metallic nano materials.

Further, another technical problem to be solved by the present invention is to provide a method of fabricating a metallic nano structure which may be welded and sintered at room temperature or low temperature and may be easily welded and sintered even in a multi-layered structure.

Another object of the present invention is to provide a reliable electrical device using the metallic nano structure having the above-described advantages.

According to an aspect of the present invention, there is provided a metallic nano structure comprising: a plurality of metallic nano materials; and a junction locally disposed in an area where the metallic nano materials adjacent to each other among the plurality of metallic nano materials are in contact with each other for bonding the metallic nano materials adjacent to each other.

Further, in one embodiment, the plurality of metallic nano materials have a crystal structure, and the junction has the crystal structure, and the crystal structure of the junction may include both of the crystal direction of the first metallic nano material and the crystal orientation of the second metallic nano material among the metallic nano materials adjacent to each other.

In one embodiment, the junction may include a part of the surfaces of the first metallic nano material and a part of the surfaces of the second metallic nano material of the metallic nano materials adjacent to each other.

In one embodiment, the metallic nano materials may include metallic nano wires, metallic nano particles, metallic nano rods, metallic nano discs, metallic nano patterns, metallic nano blocks, metallic fibers and metallic filaments, or combinations thereof.

In one embodiment, a part of the metallic nano materials adjacent to each other may cross each other to form a nano gap.

In one embodiment, it may further comprise a flexible polymer substrate providing a surface on which the plurality of metallic nano materials are disposed.

According to another aspect of the present invention, there may be provided a method of fabricating a metallic nano structure comprising a step for preparing a plurality of metallic nano materials by using at least more than two metallic nano materials adjacent to each other; a step for exposing the plurality of metallic nano materials to corrosive vapor; a step for forming a localized etchant in which the corrosive vapor is selectively condensed in a region where the at least more than two adjacent metallic nano materials are in contact with each other; a step for dissolving a portion of the region where the at least more than two adjacent metallic nano materials are in contact with by using the localized etchant; and a step for resolidifying the dissolved portion of at least more than two adjacent metallic nano materials to form a junction that bonds the at least more than two adjacent metallic nano materials.

In one embodiment, the plurality of metallic nano materials has a crystal structure, the junction has the crystal structure, and the crystal structure of the junction may include both of the crystal orientation of the first metallic nano material and the crystal orientation of the second metallic nano material among the metallic nano materials adjacent to each other.

In one embodiment, the corrosive vapor may comprise at least one of hydrogen peroxide, sulfuric acid, hydrochloric acid, nitric acid, and steam of hydrogen iodide.

In one embodiment, the plurality of metallic nano materials may comprise metallic nano wires, metallic nano particles, metallic nano rods, metallic nano discs, metallic nano patterns, metallic nano blocks, metal fibers and metal filaments, or combinations thereof. The metallic nano particles may include Ag, Cu, Fe, Ni, Co, an alloy thereof, or a combination thereof.

In one embodiment, the step for exposing the plurality of metallic nano materials to the corrosive vapor may be performed through a process for supplying (spraying) the corrosive vapor to the plurality of metallic nano materials, or a process for transferring the plurality of metallic nano materials into the spaces filled with the corrosive vapor.

In one embodiment, the time for exposing the plurality of metallic nano materials to corrosive vapor at room temperature may comprise a range of 5 minutes to 30 minutes.

An electrical apparatus according to another aspect of the present invention may include a substrate; and a metallic nano structure.

In one embodiment, the electrical device may include any one of an electrode using the metallic nano structure, a photovoltaic cell, a sensor, and a heater, wherein the heater may be formed so that a first electrode and a second electrode may be spaced apart from each other on the metallic nano structure layer.

According to an embodiment of the present invention, a plurality of metallic nano materials are exposed to corrosive vapor, and a localized etchant formed by selectively condensing corrosive vapor in regions where the metallic nano materials adjacent to each other are in contact with to each other among the plurality of metallic nano materials dissolves a part of a region where the metallic nano materials adjacent to each other are in contact with each other. As a result of it, it is possible to bond the metallic nano materials adjacent to each other and is also possible to fabricate a bonded nanostructure wherein the metallic nano materials adjacent to each other are easily and reliably bonded under a state where the metallic nano materials are adjacent to each other, in a stereotyped or non-stereotyped manner such as a stacked structure or a laminated structure.

Further, by using the corrosive vapor, it is unnecessary to use a heat source for bonding the metallic nano materials, and a bonding process is performed through the junctions of the metallic nano materials adjacent to each other, which are locally disposed in the region where the adjacent metallic nano materials are in contact with each other. Thus, it is possible to provide a reliable metallic nano structure and electrical device.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
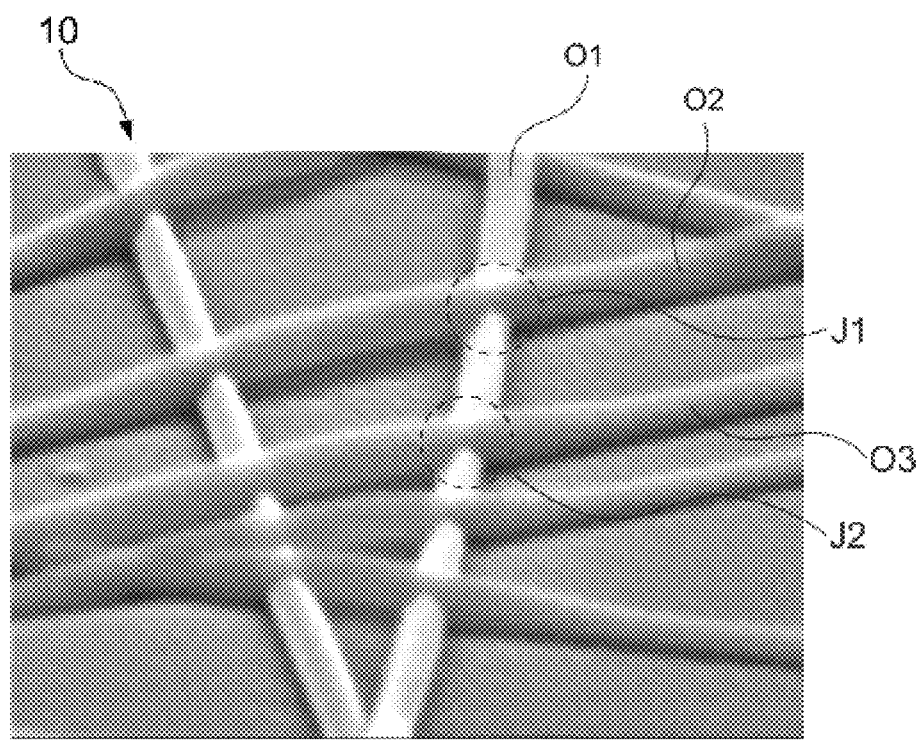
FIG. 1 is a diagram illustrating a metallic nano wire network that is one of the metallic nano materials bonded by a corrosive vapor according to one embodiment of the present invention.
Figure 1:
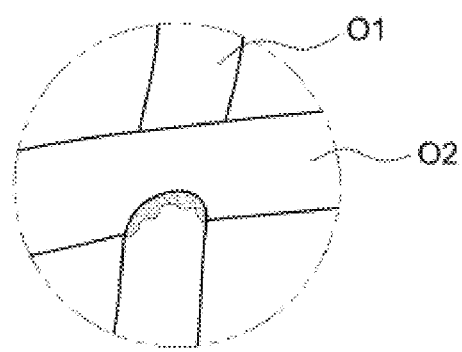

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is an image illustrating a bonded metallic nano wire network 10 according to an embodiment of the present invention.

Referring to FIG. 1, a metallic nano wire network 10 may include a plurality of metal nano wires; and a plurality of junctions locally disposed in a region where the metallic nano wires adjacent to each other among the plurality of metallic nano wires are in contact with each other for bonding the metallic nano wires adjacent to each other. For example, the metallic nano wire network 10 may include a first metallic nano wire 01, a second metallic nano wire 02 and a third metallic nano wire 03; a junction J1 of the first metallic nano wire 01 and the second metallic nano wire 02; and a junction J2 of the first metallic nano wire 01 and the third metallic nano wire 03. The first metallic nano wire 01 and the second metallic nano wire 02 are first metallic nano materials adjacent to each other, and the first metallic nano materials adjacent to each other may be bonded by the junction J1. The first metallic nano wire 01 and the third metallic nano wire 03 are also second metallic nano materials adjacent to each other, and the second metallic nano materials adjacent to each other may be bonded by the junction J2.

The junction J1 may include a part of the surfaces of the first metallic nano wire 01, and a part of the surfaces of the second metallic nano wire 02 among the first metallic nano wire 01 and the second metallic nano wire 02 which are adjacent to each other. The junction J2 may include a part of the surfaces of the first metallic nano wire 01, and a part of the surfaces of the third metallic nano wire 03 among the first metallic nano wire 01 and the third metallic nano wire 03 which are adjacent to each other. Referring to an enlarged view of the junction J1, a part of the surfaces of the first metallic nano wires 01 adjacent to each other and a part of the surfaces of the second metallic nano wires 02, which are adjacent to each other, are adhered to each other, so that the first metallic nano wires 01, and the second metallic nano wire 02 may be bonded, which may be regarded as a single metallic nano structure.

The first metallic nano wire 01, the second metallic nano wire 02 and the third metallic nano wire 03 have the same or different crystal structures, respectively, and the crystal structure of at least one or more metallic nano wires may appear in the junctions J1 and J2. For example, the crystal structure of the junction J1 may include both the crystal direction of the first metallic nano wire 01 and the crystal direction of the second metallic nano wire 02 among the metallic nano materials adjacent to each other. In addition, the junction J1 may include a part of the surfaces of the first metallic nano wire 01 and a part of the surfaces of the second metallic nano wire 02. Likewise, the crystal structure of the junction J2 may include both the crystal direction of the first metallic nano wire 01 and the crystal direction of the third metallic nano wire 03 among the metallic nano materials adjacent to each other. In addition, the junction J2 may include a part of the surfaces of the first metallic nano wire 01 and a part of the surfaces of the third metallic nano wire 03.

The metallic nano materials including the first metallic nano wire 01, the second metallic nano wire 02, and the third metallic nano wire 03 may be disposed on the flexible polymer substrate, but the present invention is not limited thereto. The material of the flexible polymer substrate includes PDMS (polydimethylsiloxane), PET (polyethylene terephthalate), epoxy resin, acrylic resin and PP (polypropylene), or a combination thereof, and the present invention is not limited thereto. The electrical device may be provided by arranging the metallic nano structure on which the metallic nano materials are bonded on the surface of the flexible polymer substrate.

Although the bonding of metallic nano materials such as metallic nano wires has been described in FIG. 1, the present invention is not limited to metallic nano wires. For example, the metallic nano materials may include metallic nano particles, metallic nano rods, metallic nano discs, metallic nano patterns, metallic nano blocks, metal fibers and metal filaments, or combinations thereof as well as the metallic nano wires.

Figure 2:
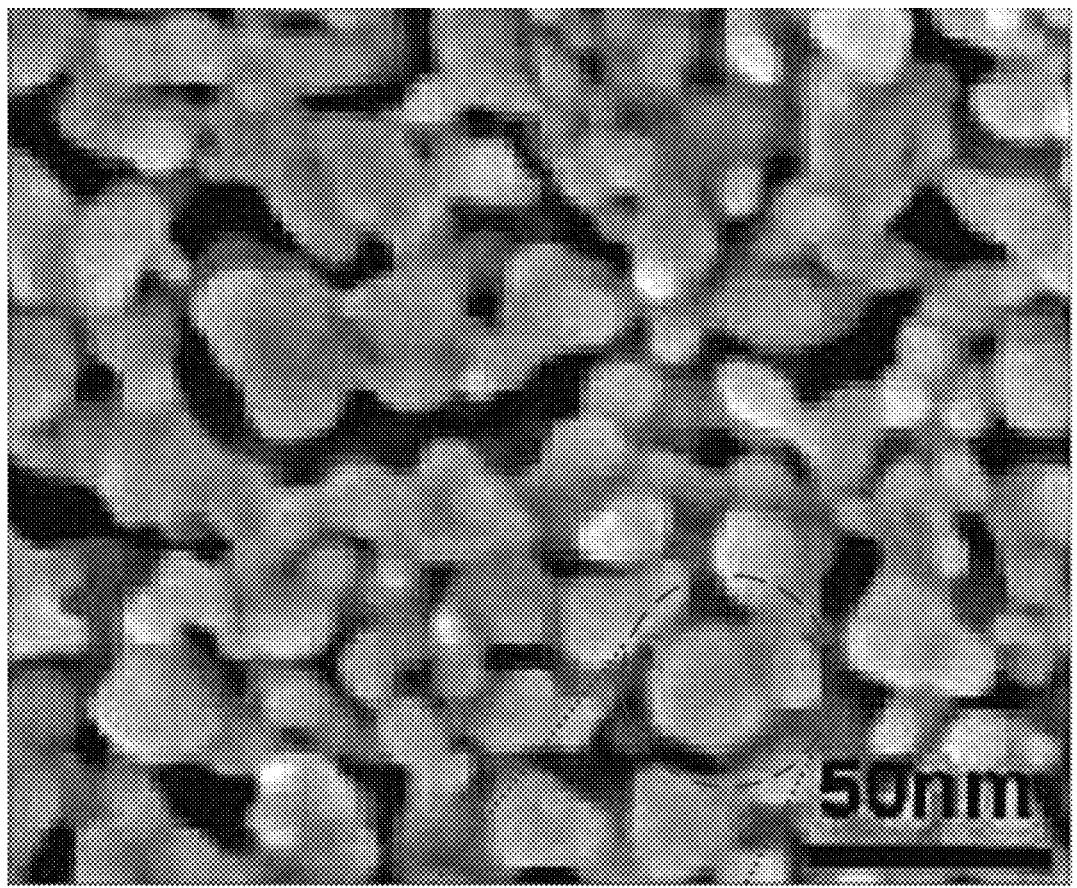
FIG. 2 is a diagram illustrating metallic nano particles that is one of a metallic nano materials bonded by corrosive vapor according to an embodiment of the present invention.
Figure 2:
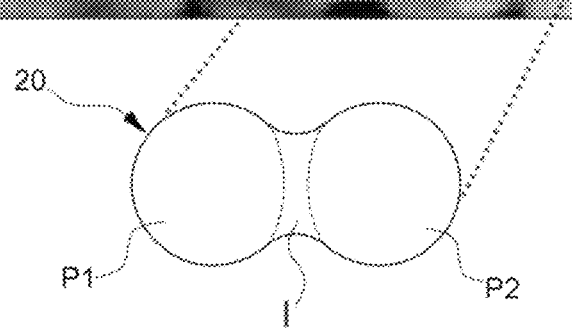

FIG. 2 illustrates metallic nano particles that are one of the metallic nano materials bonded by the corrosive vapor according to one embodiment of the present invention.

Referring to FIG. 2, the metallic nano structure 20 may include a plurality of metallic nano particles; and a plurality of junctions which are disposed locally in a region where the adjacent metallic nano particles among the plurality of metallic nano particles are in contact with each other, so that the adjacent metallic nano particles may be bonded. For example, the plurality of metallic nano structures 20 may include a first metallic nano particle P1, a second metallic nano particle P2, and a junction I between the first metallic nano particle P1, and the second metallic nano particle P2. The first metallic nano particle P1 and the second metallic nano particle P2 are the metallic nano materials that are adjacent to each other, and the plurality of metallic nano structures 20 include the junction I which are locally disposed in a region where the metallic nano materials adjacent to each other are in contact with each other, so that the adjacent metallic nano materials may be bonded. In one embodiment of the invention, three or more metallic nano particles may be sequentially bonded, and at this time, two or more junctions between the metallic nano particles may exist. In another example, two or more metallic nano particles may be arranged adjacently to form a single junction.

The first metallic nano particles P1 and the second metallic nano particles P2 may be a nano material selected from the group consisting of metallic nano wires, metallic nano rods, metallic nano discs, metallic nano patterns, metallic nano blocks, metal fibers and metal filaments, or a combination thereof, and the present invention is not limited thereto. The metallic nano particles are metallic nano materials including Ag, Cu, Fe, Ni, Co, an alloy containing them, or a combination thereof, but the present invention is not limited thereto.

The junction I may include a part of the surfaces of the first metallic nano particles P1 and a part of the surfaces of the second metallic nano particles P2 among the first metallic nano particles P1 and the second metallic nano particles P2 which are adjacent to each other.

Figure 3:
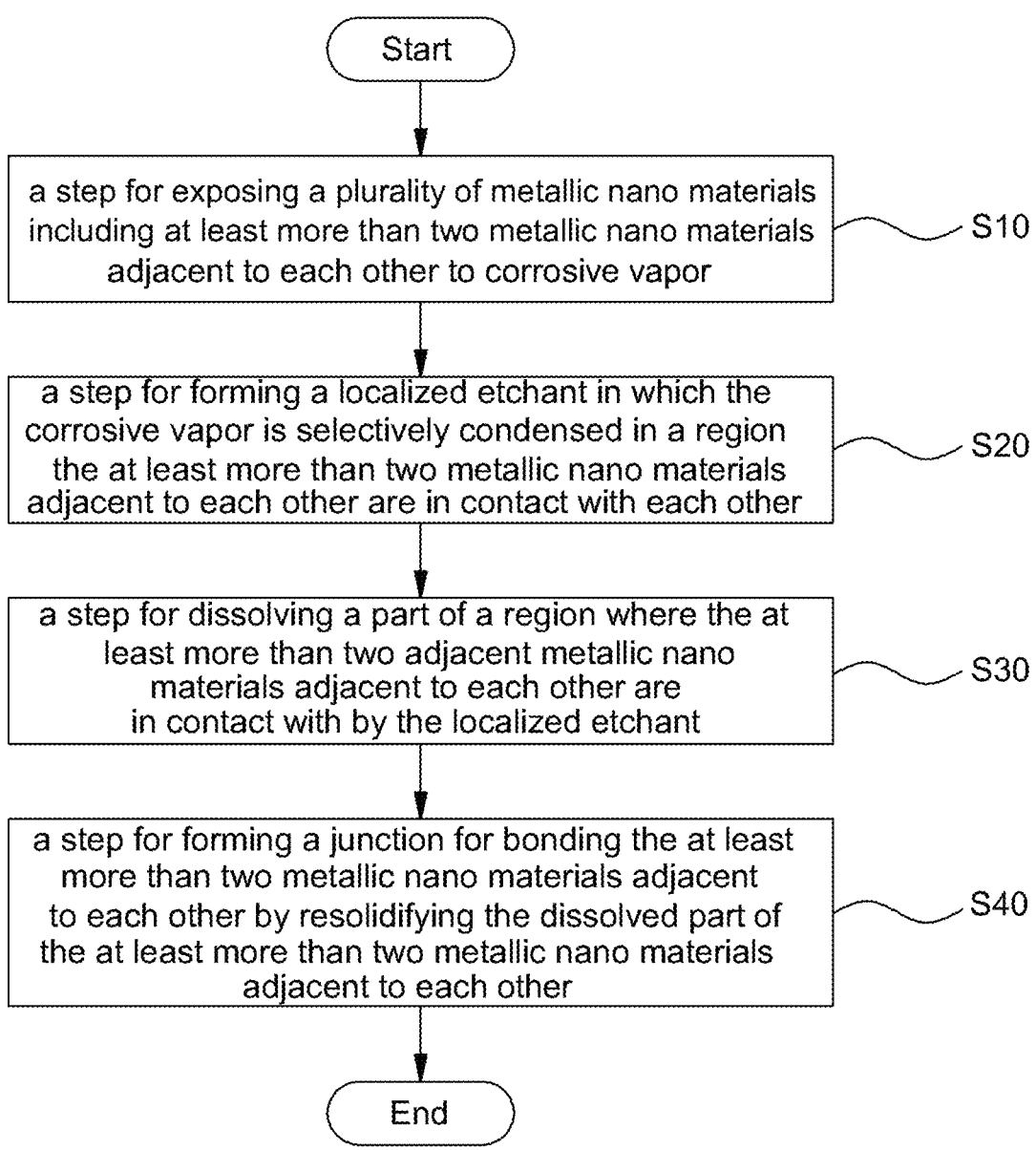
FIG. 3 is a flow chart for explaining a bonding method of a metallic nano material according to an embodiment of the present invention.

FIG. 3 is a diagram illustrating a method of fabricating a metallic nano structure according to an embodiment of the present invention Referring FIG. 3, a method of fabricating a metallic nano structure comprising a step S10 for exposing a plurality of metallic nano materials comprising at least two adjacent metallic nano materials to a corrosive vapor, a step for S20 forming a localized etchant in which the corrosive vapor is selectively condensed in a region where the at least two adjacent metallic nano materials are in contact with each other, a step for S30 for dissolving a portion of the region where the at least two adjacent metallic nano materials are in contact with each other by using the localized etchant, and a step for S40 for forming a junction for bonding the at least two adjacent metallic nano materials by resolidifying the dissolved portion of the at least two adjacent metallic nano materials may be provided.

The plurality of metallic nano materials may have a crystal structure and the junction may have crystal structures of the at least two mutually adjacent metallic nano materials, and the crystal structure of the junction may include both of the crystal orientation of the first metallic nano material and the crystal orientation of the second metallic nano material, which are adjacent to each other. The corrosive vapor includes at least any one selected from hydrogen peroxide, sulfuric acid, hydrochloric acid, nitric acid, and hydrogen iodide vapor, but the present invention is not limited thereto. When hydrogen peroxide, which is one of the corrosive vapor, is used, since water ($H_2O$) is generated as a by-product after bonding the metallic nano materials, a bonding method which is harmless to the environment may be provided. The time for exposing the plurality of metallic nano materials to corrosive vapor at room temperature may range from 5 minutes to 30 minutes. For example, if the exposure time of the corrosive vapor is less than 5 minutes, the localized etchant for the tight and strong bonding between the metallic nano materials may not sufficiently condensed in the adjacent region, and if the corrosion time exceeds 30 minutes, since the localized etchant is excessively condensed, the localized etchant not be formed. However, the time for exposing the plurality of metallic nano materials to corrosive vapor at high temperatures may be shortened as the amount of the corrosive vapor increases much more at room temperature.

The plurality of metallic nano materials may include metallic nano wires, metallic nano particles, metallic nano rods, metallic nano disc, metallic nano patterns, metallic nano blocks, metal fibers and metal filaments, or combinations thereof. Further, the step for exposing the plurality of metallic nano materials to the corrosive vapor may be performed by supplying (or spraying) the corrosive vapor to the plurality of metallic nano materials or transferring the plurality of metallic nano materials to a space filled with the corrosive vapor.

Figure 4A:
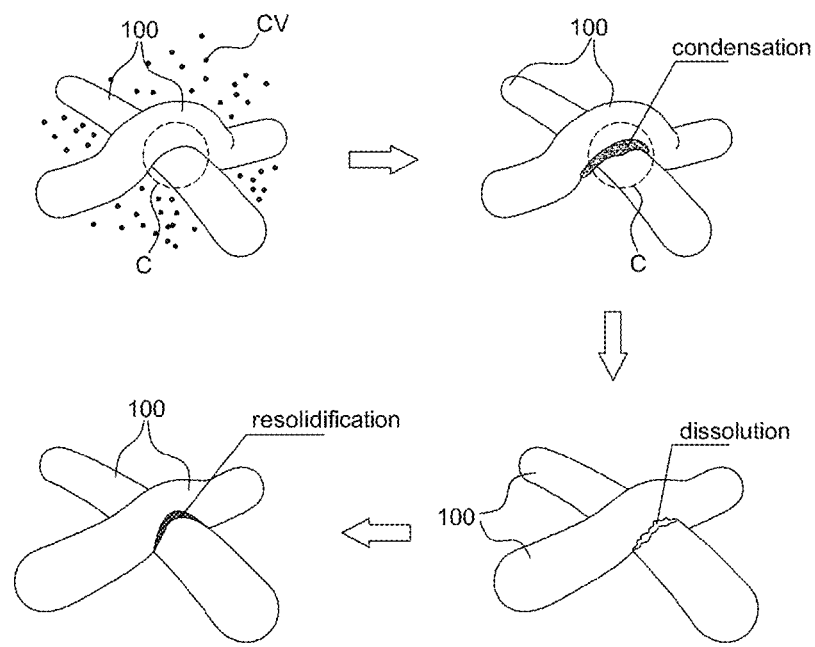
FIGS. 4A and 4B are the diagrams for explaining the bonding processes of the metallic nano wires and the metallic nano particles which are executed based on the flow chart of FIG. 3 according to an embodiment of the present invention, respectively.

FIG. 4A is a diagram for explaining a process of forming a junction of metallic nano wires 100, which is one of metallic nano materials. The metallic nano wires 100 adjacent to each other include a region C (or an intersection region) in which the adjacent metallic nano wires 100 are in contact with each other. A portion of the metallic nano materials adjacent to each other may cross each other to form a nano gap. The nano gap may refer to a region where the portions of the metallic nano materials adjacent to each other cross each other and the portion is formed in contact with or adjacent to each other. Such a nano gap may be a junction according to the manufacturing method described below.

Referring to FIG. 4A, in a first step S10, a plurality of metallic nano wires 100 including the adjacent metallic nano wires 100 are exposed to the corrosive vapor CV. The step for exposing the plurality of metallic nano wires 100 to the corrosive vapor CV may be performed through a process for supplying the corrosive vapor CV to the plurality of metallic nano wires 100, or a process for transferring the plurality of metallic nano materials to a space filled with the corrosive vapor CV.

Supply of the corrosive vapor CV to the plurality of metallic nano wires 100 may include spraying, spreading, spin coating and spray coating the corrosive vapor CV on the plurality of metallic nano wires 100, and these supply methods are only exemplary. Thus, the present invention is not limited thereto. In addition, the transfer of the plurality of metallic nano wires 100 into the space filled with the corrosive vapor CV means movement, transmission, and delivery, and these methods are only exemplary. Thus, the present invention is not limited thereto.

In the second step S20, the corrosive vapor CV may penetrate into the region C where the adjacent metallic nano wires 100 contact with each other by capillary condensation and condenses to form a selectively condensed localized etchant. In the third step S30, the localized etchant may dissolve a part of the region where the adjacent metallic nano wires 100 are in contact with each other. Some of the regions are localized, and the present invention is not limited thereto.

When a part of the region where the adjacent metallic nano wires 100 are in contact with each other is dissolved, a part of the region where the dissolved metallic nano wires 100 are in contact with each other is resolidified in the fourth step S40. The resolidified regions are junctions that bond the adjacent metal wires. At this time, even though a part of the region where the adjacent metallic nano wires 100 are in contact with each other is dissolved by the localized, the adjacent metallic nano wires 100 maintain their own crystal structure, and thus, all of the crystal structures of the metallic nano wires adjacent to each other may appear at the junction of the metal nano wires 100.

Figure 4B:
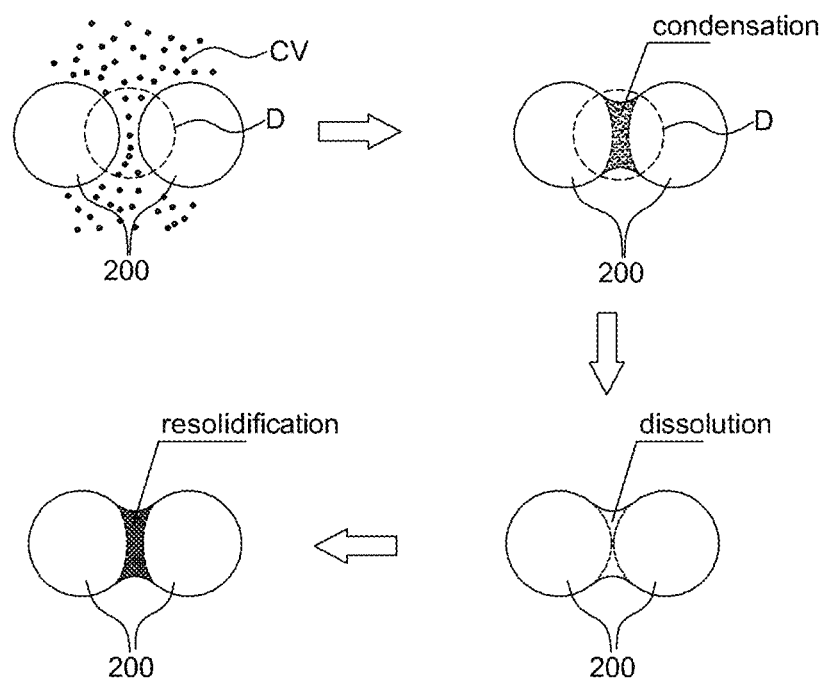

Referring to FIG. 4B, it is a diagram explaining a process for forming a junction of metallic nano particles 200, which is one of the metallic nano materials. The metallic nano particles 200 adjacent to each other include a region D in which the adjacent metallic nano particles 200 are in contact with each other. In the first step S10, a plurality of metallic nano particles 200 including the metallic nano particles 200 adjacent to each other are exposed to the corrosive vapor (CV). The step for exposing the plurality of metallic nano particles 200 to the corrosive vapor CV may be performed through a process for supplying the corrosive vapor CV to the plurality of metallic nano particles 200, or a process for transferring the plurality of metallic nano particles 200 to a space filled with the corrosive vapor CV.

Supply of the corrosive vapor CV to the plurality of metallic nano particles 200 is performed by spraying, spreading, spin coating or spray coating the corrosive vapor CV on the plurality of metallic nano particles 200 and these supply methods are only exemplary. Thus, the present invention is not limited thereto.

The transfer of the plurality of metallic nano wires 100 into the space filled with the corrosive vapor (CV) means movement, transmission, and delivery, and these methods are only exemplary. Thus, the present invention is not limited thereto.

In the second step S20, the corrosive vapor CV may penetrate into the region D where the adjacent metallic nano wires 100 contact with each other by capillary condensation, and then, condenses to form a selectively condensed localized etchant. In the third step S30, the localized etchant may dissolve a part of the region where the adjacent metallic nano wires 100 are in contact with each other. Some of the regions are localized, and the present invention is not limited thereto. When a part of the region where the adjacent metallic nano wires 100 are in contact with each other is dissolved, a part of the region where the dissolved metallic nano wires 100 are in contact with each other is resolidified in the fourth step S40. The resolidified regions are junctions that bond the adjacent metal wires.

As described above, by exposing a plurality of metallic nano materials to corrosive vapor, the corrosive vapor is selectively condensed in regions of the plurality of metallic nano materials adjacent to each other among adjacent metallic nano materials to form a localized etchant. Thus, it is possible to bond the metallic nano materials adjacent to each other at room temperature by dissolving and resolidifying a part of the region where the adjacent metallic nano materials are in contact with each other.

Further, it is unnecessary to use a heat source for bonding the metallic nano materials by using the corrosive vapor, and a bonding process is performed through the junctions of the adjacent metallic nano materials, which are locally disposed in the region where the adjacent metallic nano materials are in contact with each other. Therefore, it is possible to provide a reliable metallic nano structure and electrical device.

Further, since the metallic nano materials adjacent to each other are bonded using the corrosive vapor (CV), there is no restriction of a shadow effect occurring in laser welding, and the metallic nano materials may be firmly bonded as a whole.

Figure 5A:
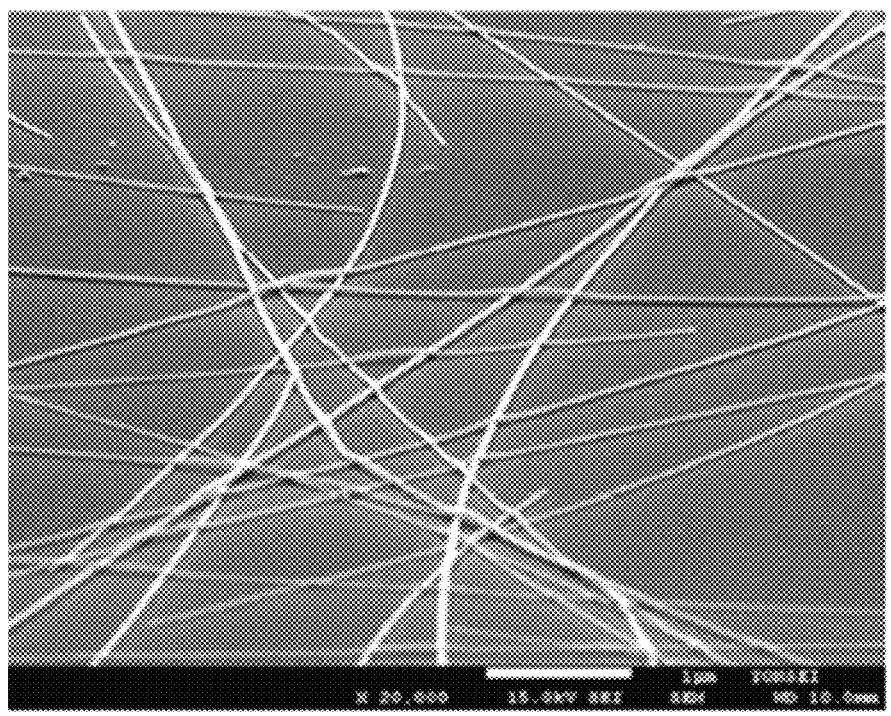
FIGS. 5A and 5B are the diagrams illustrating the images of the metallic nano wire networks before and after a bonding process according to an embodiment of the present invention by using a scanning electron microscope SEM.

FIG. 5A is an image of a metallic nano wire network before bonding according to an embodiment of the present invention outputted by using a scanning electron microscope (SEM). Specifically, it is a metallic nano wire network comprising at least two or more adjacent metallic nano wires.

Figure 5B:
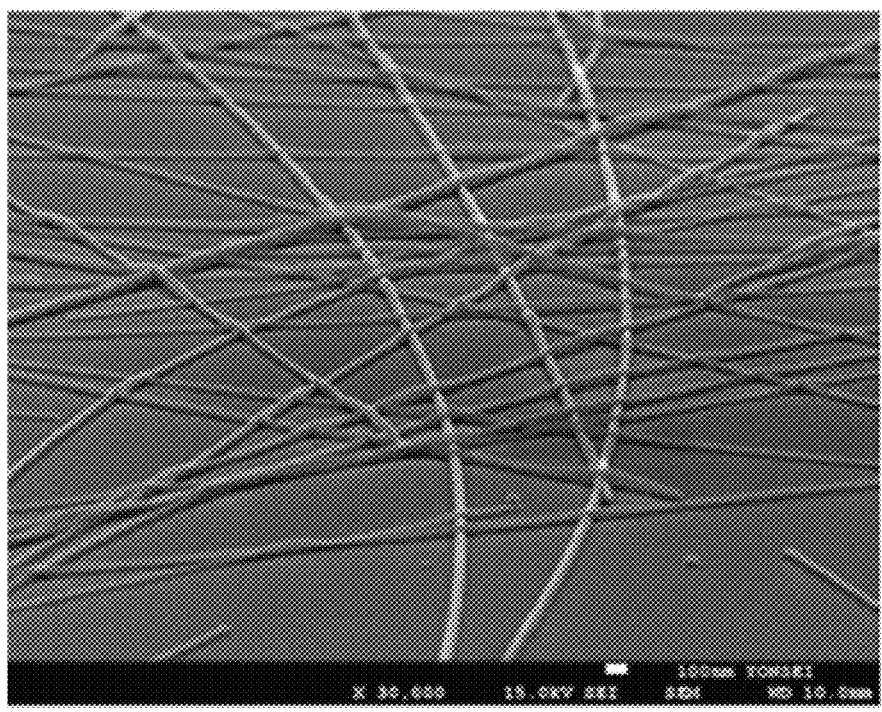

FIG. 5B is an image of a bonded metallic nano wire network according to an embodiment of the present invention outputted by using a scanning electron microscope. Specifically, it is a metallic nano structure for bonding at least two adjacent metallic nano wires to each other through the above-mentioned method of fabricating the metallic nano structure.

Referring to FIG. 5B, it can be seen that the corrosive vapor condenses due to the capillary condensation in the areas where at least two adjacent metallic nano materials are in contact with or cross each other to form a localized etchant, and a portion of the region where at least two adjacent metallic nano materials are in contact with or intersect each other is dissolved and resolidified by the localized etchant. The metallic nano structure of FIG. 5B has tighter and stronger bond between the metallic nano materials as compared with the metallic nano structure of FIG. 5A.

Figure 6:
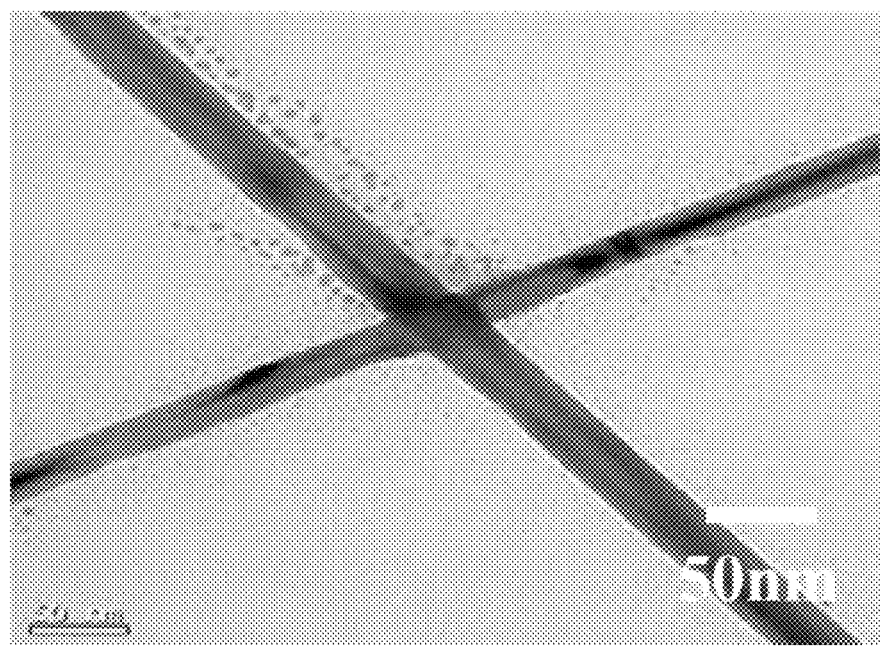
FIG. 6 is a TEM (transmission electron microscope) image illustrating a junction of bonded metallic nano wires according to an embodiment of the present invention.

FIG. 6 is an image of a junction that is locally disposed in a region where metallic nano wires adjacent to each other among the metallic nano wires according to an embodiment of the present invention are in contact with, so that the adjacent the metallic nano materials may be bonded, which is outputted by using a transmission electron microscope (SEM).

Figure 7A:
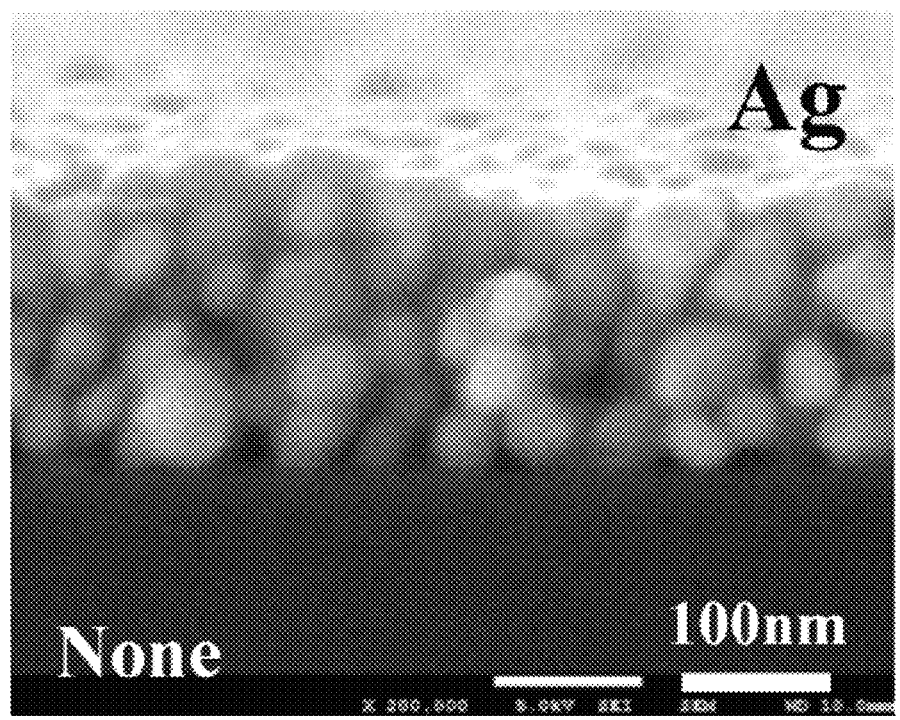
FIGS. 7A and 7B are SEM images showing Ag metallic nano particles before and after bonding according to an embodiment of the present invention.
Figure 7B:
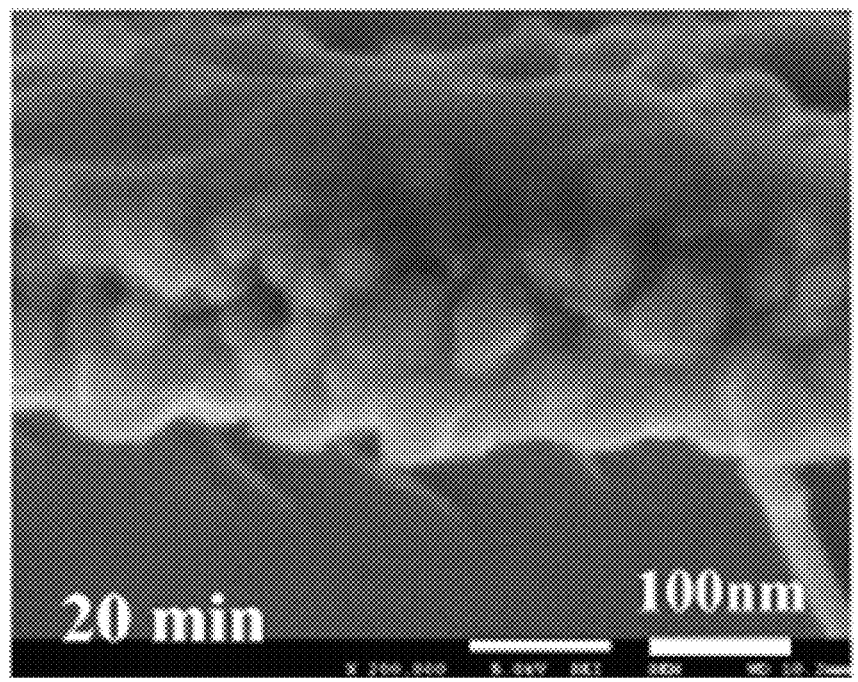
Figure 7C:
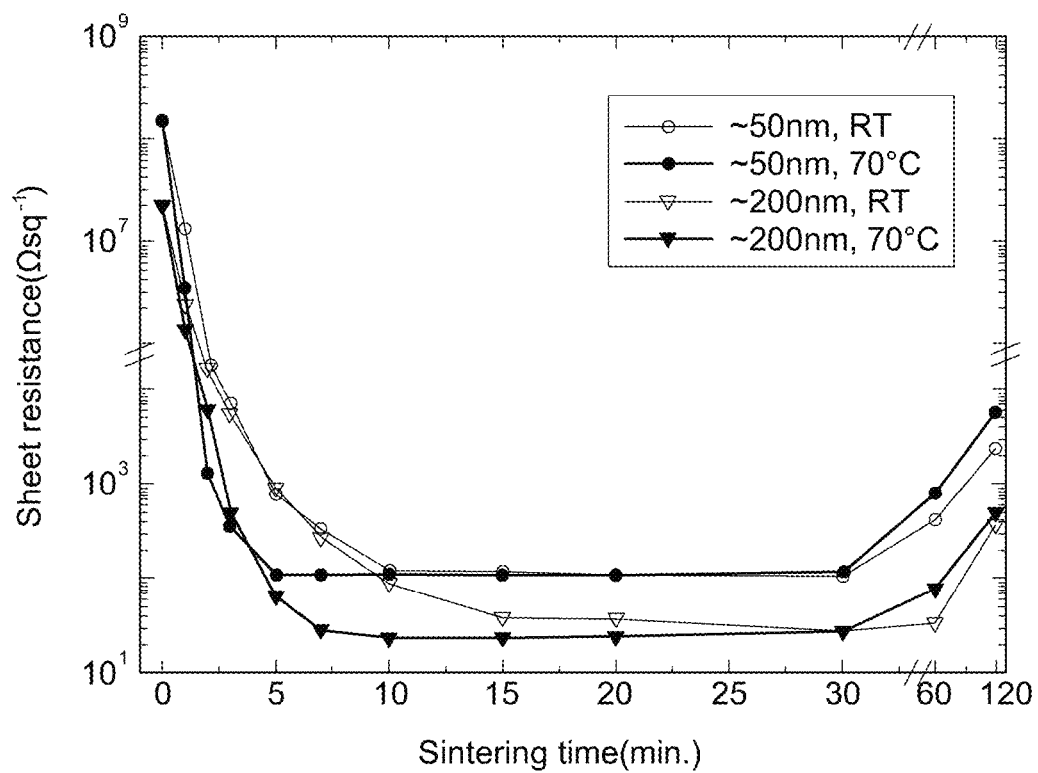
FIG. 7C is a graph showing changes in resistance values according to welding and sintering time.

FIG. 7A is an image of an Ag nano particle layer containing Ag nano particles before bonding according to an embodiment of the present invention, which is outputted by using a scanning electron microscope. FIG. 7B is an image of Ag nano particles containing bonded Ag nano particles according to an embodiment of the present invention, which is outputted by using a scanning electron microscope. FIG. 7C is a graph showing a change in resistance value of the Ag nano particle layer according to sintering time of Ag nano particles.

Referring FIG. 7A and FIG. 7B, specifically, the Ag nano particle layer includes at least more than two adjacent Ag nano particles and is a metallic nano structure in which at least more than two adjacent Ag nano particles are bonded through the above-described metallic nano material bonding method. As a part of the individual Ag nano particles dissolve and resolidify, the shape of the individual Ag nano particles does not appear.

Referring to FIG. 7C, the thickness of the Ag nano particle layer of about 50 nm and the thickness of the Ag nano particle layer of about 200 nm were compared in terms of temperature change. As the thickness of the nano particle layer is getting thicker, the resistance value becomes lower, and as the temperature is getting higher within a certain sintering time range, the resistance value becomes lower. But, even after a certain sintering time, the resistance value according to the temperature change is constant. For example, the resistance value decreases as the temperature increases in the time range from 0 minute to 10 minutes, but the change in the resistance value according to the temperature changes is getting smaller in the time range from 10 minutes to 30 minutes.

Further, as a result of comparing the initial resistance value before the sintering (0 minutes) and the late resistance value (30 minutes) after the sintering process, it was confirmed that the resistance values of the Ag nano particle layer having a thickness of about 50 nm and the Ag nano particle having a thickness of about 200 nm were reduced by about 107 times.

Figure 8A:
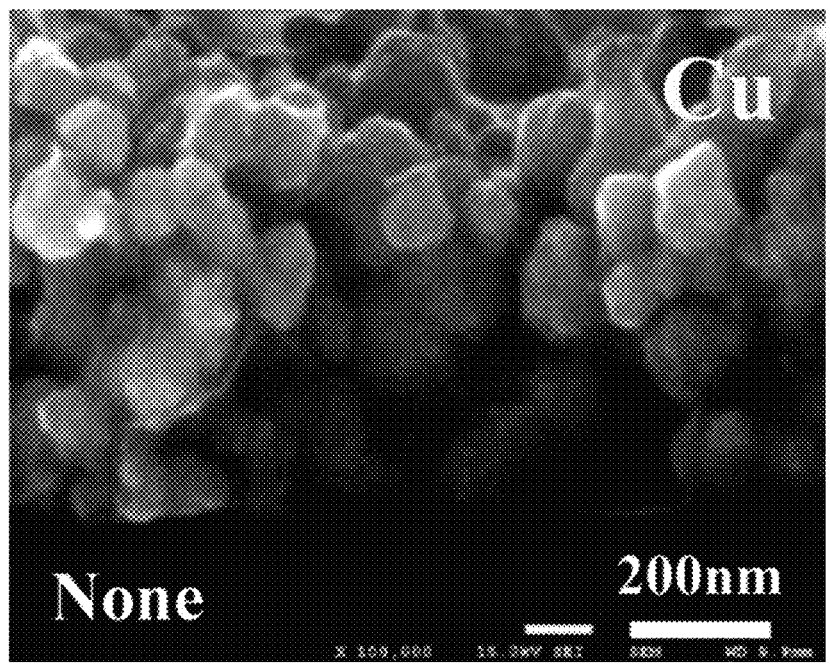
FIGS. 8A and 8B are SEM images showing Cu metallic nano particles before and after bonding according to an embodiment of the present invention.
Figure 8B:
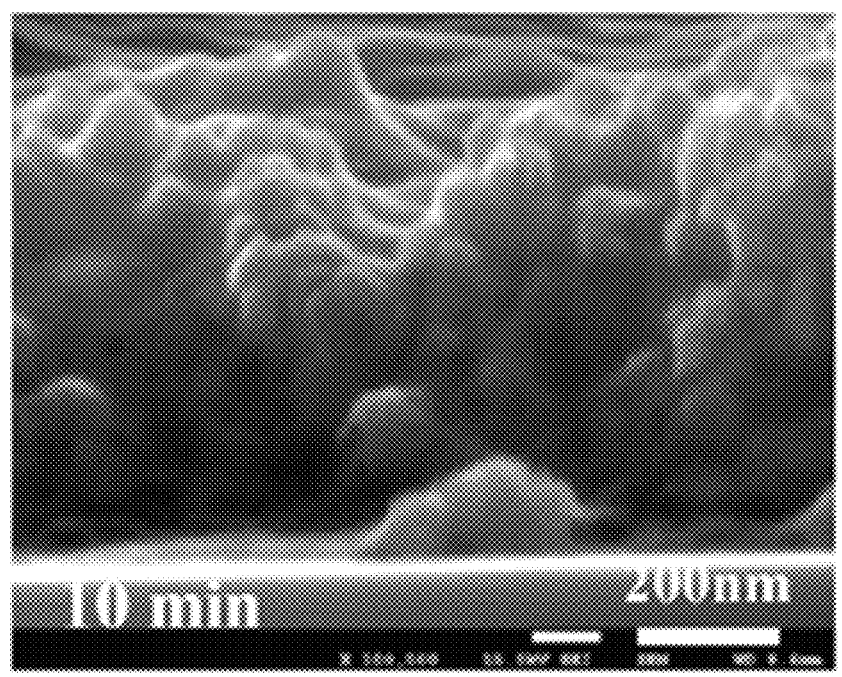
Figure 8C:
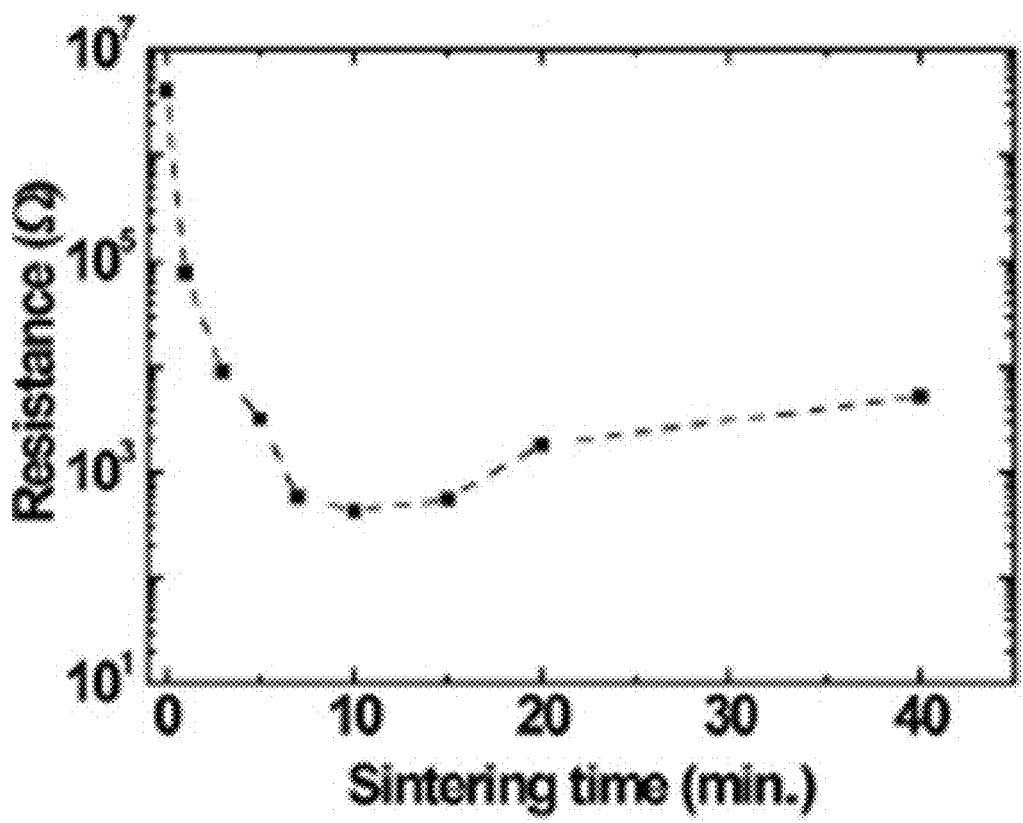
FIG. 8C is a graph showing changes in resistance values according to welding and sintering time.

FIG. 8A is an image of a Cu nano particle layer containing Cu nano particles before bonding, which is outputted by using a scanning electron microscope. FIG. 8B is a view illustrating a Cu nano particle layer containing bonded Cu nano particles according to an embodiment of the present invention, which is outputted by using a scanning electron microscope. FIG. 8C is a graph showing a change in resistance value of a Cu nano particle layer having a thickness of about 70 nm according to sintering time of Cu nano particles according to an embodiment of the present invention.

Referring to FIGS. 8A and 8B, the Cu nano particle layer includes at least more than two adjacent Cu nano particles and is the metallic nano structure for bonding at least more than two adjacent Cu nano particles through the above-mentioned metallic nano material bonding method. It may be difficult to identify individual Cu nano particles in the bonded Cu nano particles.

Referring to FIG. 8C, as a result of comparing the initial resistance value before the sintering (0 minutes) and the late resistance value after the sintering proceed (10 minutes), it was confirmed that the resistance value of the Cu nano particle layer of about 70 nm thickness is about 104 times.

Figure 9A:
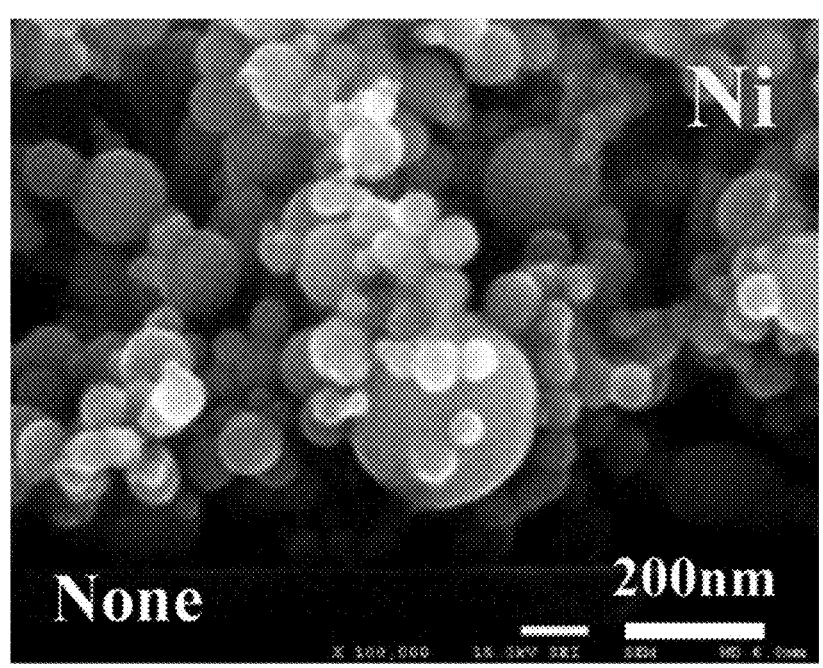
FIGS. 9A and 9B are SEM images showing Ni metallic nano particles before and after bonding according to an embodiment of the present invention.
Figure 9B:
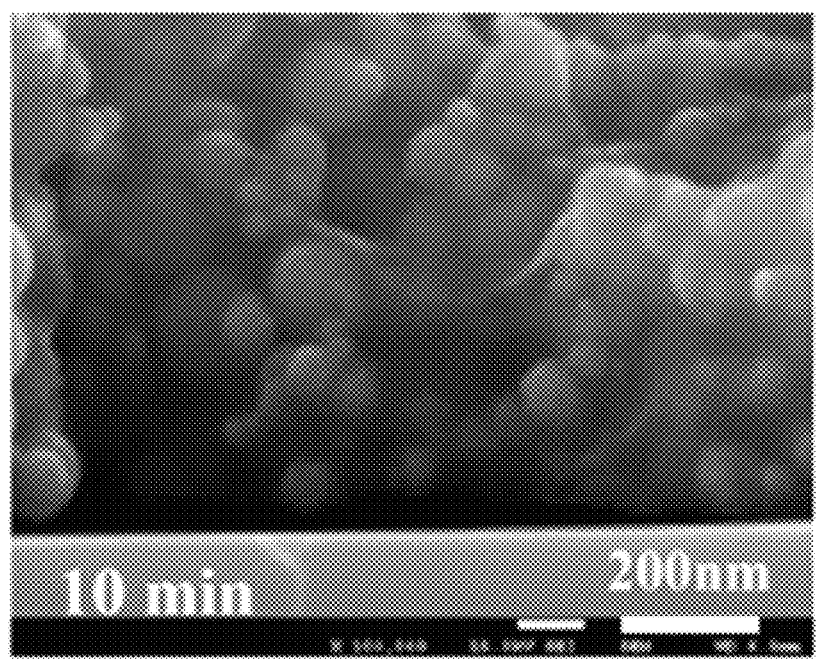
Figure 9C:
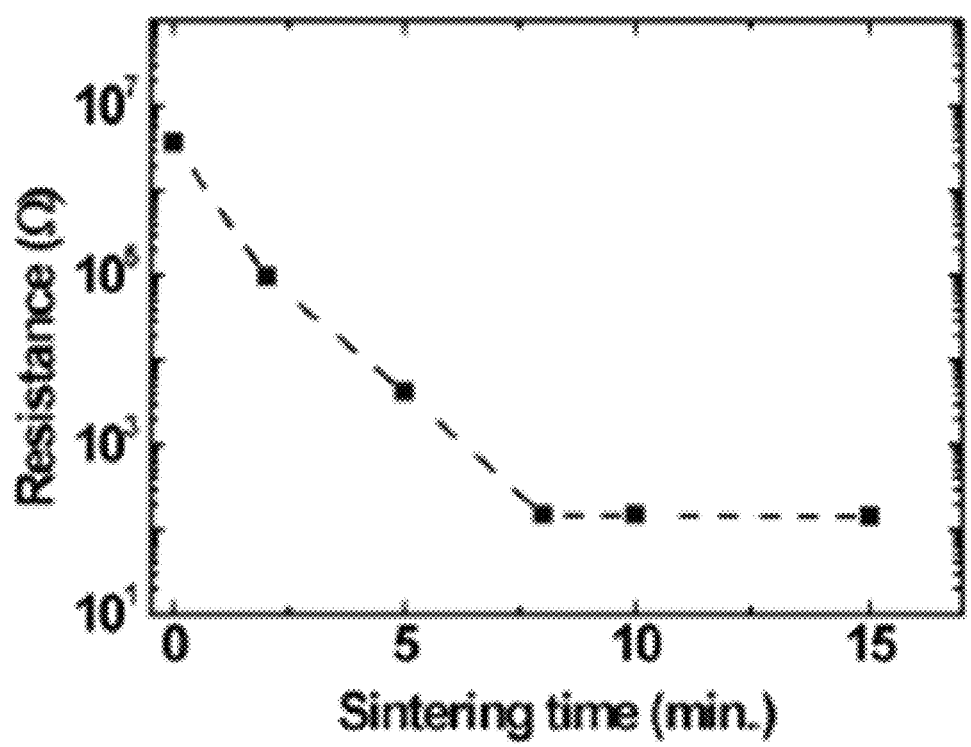
FIG. 9C is a graph showing changes in resistance values according to welding and sintering time.

FIG. 9A is an image of a Ni nano particle layer containing Ni nano particles before bonding, which is outputted by using a scanning electron microscope. FIG. 9B is a graph showing an image of a Ni nano particle layer containing bonded Ni nano particles according to an embodiment of the present invention, which is outputted by using a scanning electron microscope. FIG. 9C is a graph showing a change in resistance value of a Ni nano particle layer of about 1 μm thickness according to sintering time of Ni nano particles according to an embodiment of the present invention.

Referring to FIGS. 9A and 9B, the Ni nano particle layer includes at least more than two adjacent Ni nano particles and is a metal a nanostructure for bonding at least more than two adjacent Ni nano particles through the above-mentioned metallic nano material bonding method. It may be difficult to identify individual Ni nano particles in the bonded Ni nano particles.

Referring to FIG. 9C, as a result of comparing the initial resistance value before the sintering process (0 minutes) and the late resistance value after the sintering process proceed (10 minutes), it was confirmed that the resistance value of the Ni nano particle layer of about 1 μm thickness is reduced by about $10^5$ times. In addition, after heating the high vapor pressure, that is, the container of the etchant to 70° C., it turned out that the sintering time is reduced by about 5 minutes, which is only illustrative and the present invention is not limited thereto.

Figure 10A:
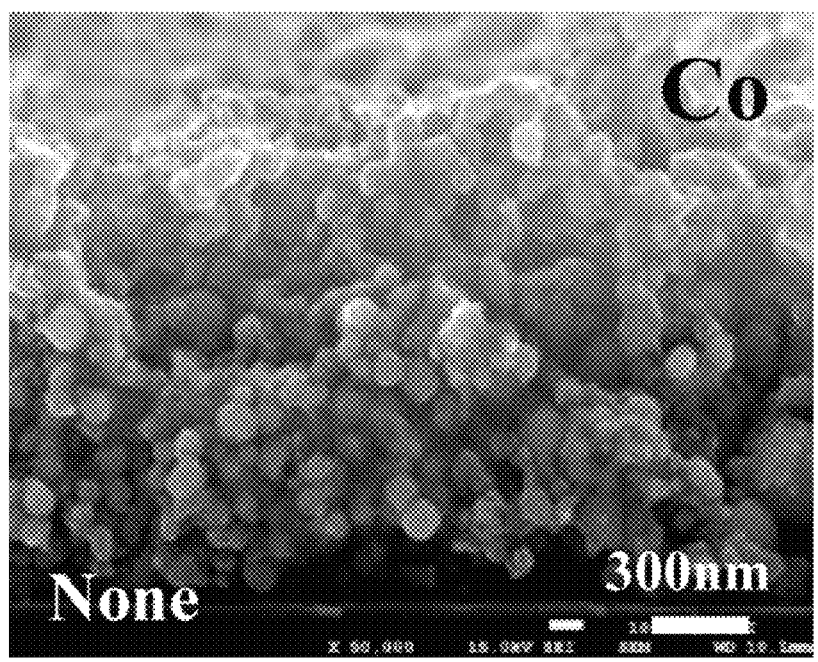
FIGS. 10A and 10B are SEM images showing Co metallic nano particles before and after bonding according to an embodiment of the present invention.
Figure 10B:
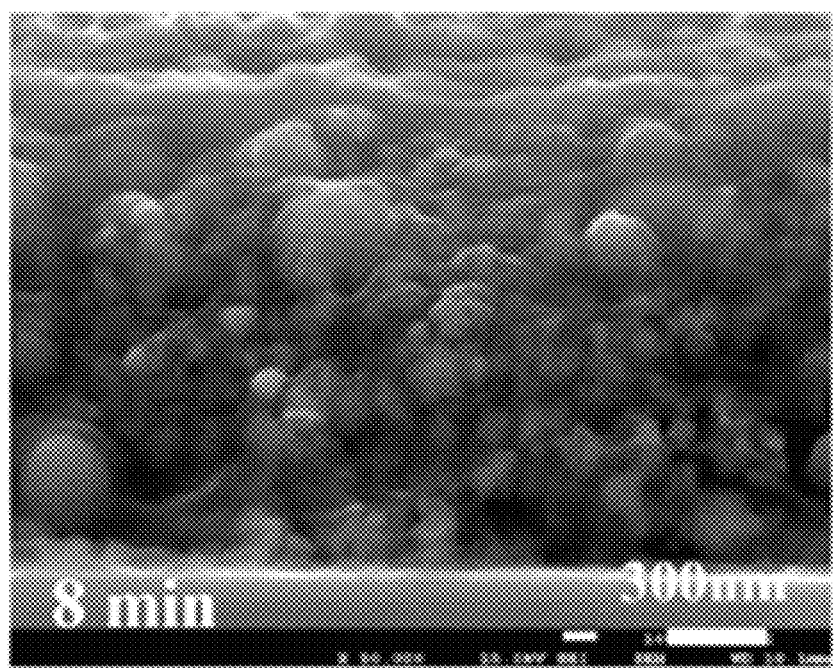
Figure 10C:
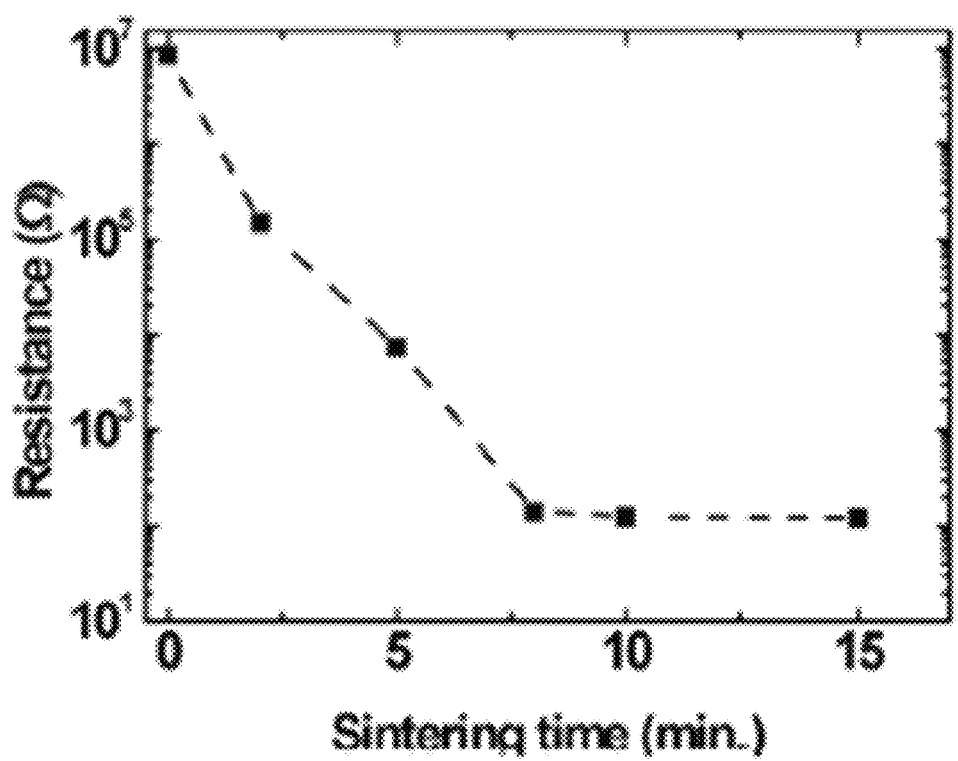
FIG. 10C is a graph showing changes in resistance values according to welding and sintering time.

FIG. 10A is an image of a Co nano particle layer containing Co nano particles before bonding, which is outputted by using a scanning electron microscope. FIG. 10B is an image of a Co nano particle layer containing bonded Co nano particles according to an embodiment of the present invention, which is outputted by using a scanning electron microscope. FIG. 10C is a graph showing a change in resistance value of a Co nano particle layer of about 1 μm thickness according to sintering time of Co nano particles according to an embodiment of the present invention.

Referring to FIGS. 10A and 10B, the Co nano particle layer includes at least more than two adjacent Co nano particles and is a metal a nanostructure for bonding at least more than two adjacent Co nano particles through the above-mentioned metallic nano material bonding method. It may be difficult to identify individual Co nano particles in the bonded Co nano particles.

Referring to FIG. 10C, as a result of comparing the initial resistance value before the sintering process (0 minutes) and the late resistance value after the sintering process proceed (10 minutes), it was confirmed that the resistance value of the Co nano particle layer of about 1 μm thickness is reduced by about $10^5$ times. In addition, after heating the high vapor pressure, that is, the container of the etchant to 70° C., it turned out that the sintering time is reduced by about 5 minutes, which is only illustrative and the present invention is not limited thereto.

Figure 11A:
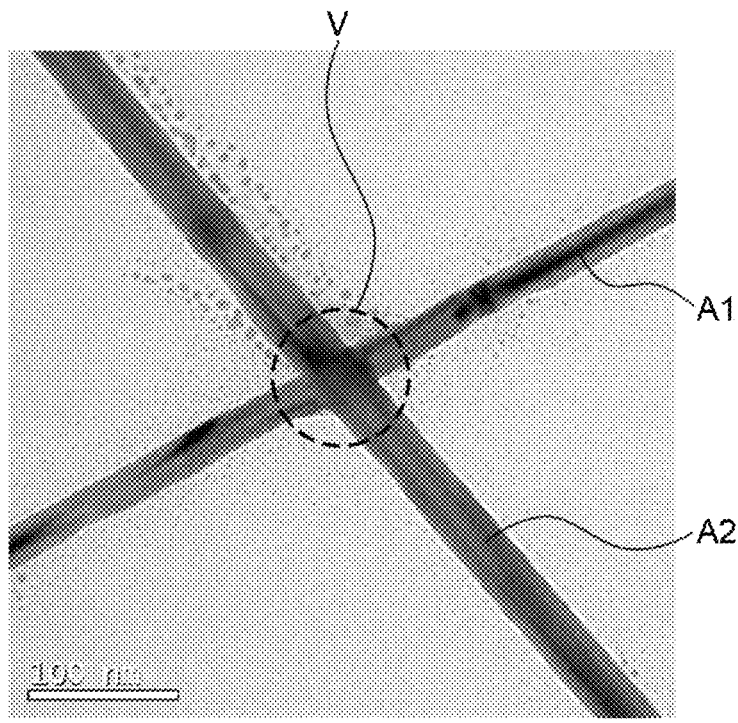
FIG. 11A is a TEM image showing a junction of bonded metallic nano wires according to an embodiment of the present invention.

FIG. 11A is a transmission electron microscope image for illustrating a junction of bonded metal nano wires according to an embodiment of the present invention. The metal nano wires are made of metal nano wires having a crystal structure, and the junctions have the crystal structure. The bonded metal nano wires include a first metal nano wire A1 and a second metal nano wire A2 and a junction V between the first metal nano wire A1 and the second metal nano wire A2.

Figure 11B:
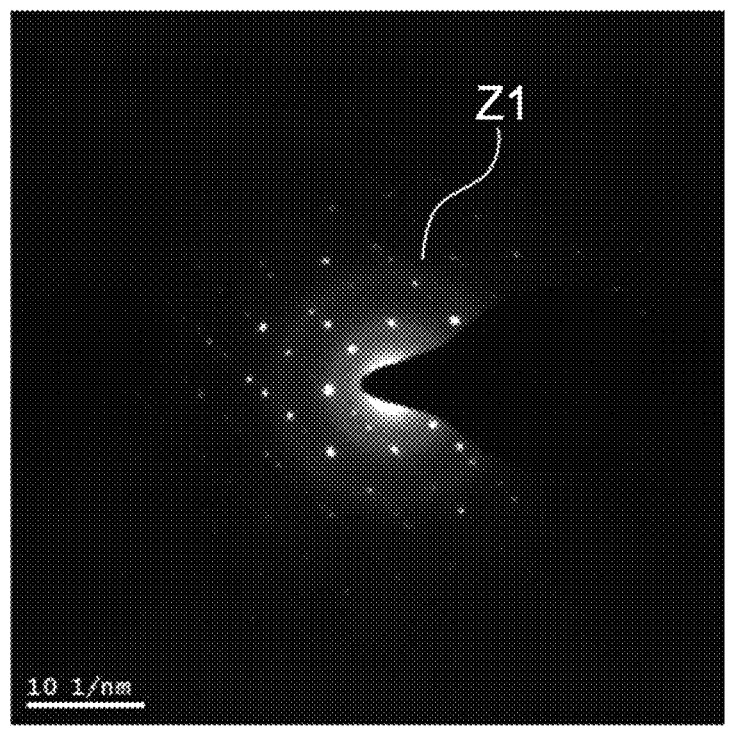
FIGS. 11B to 11D are the diagrams showing crystal directions of metallic nano wires.
Figure 11C:
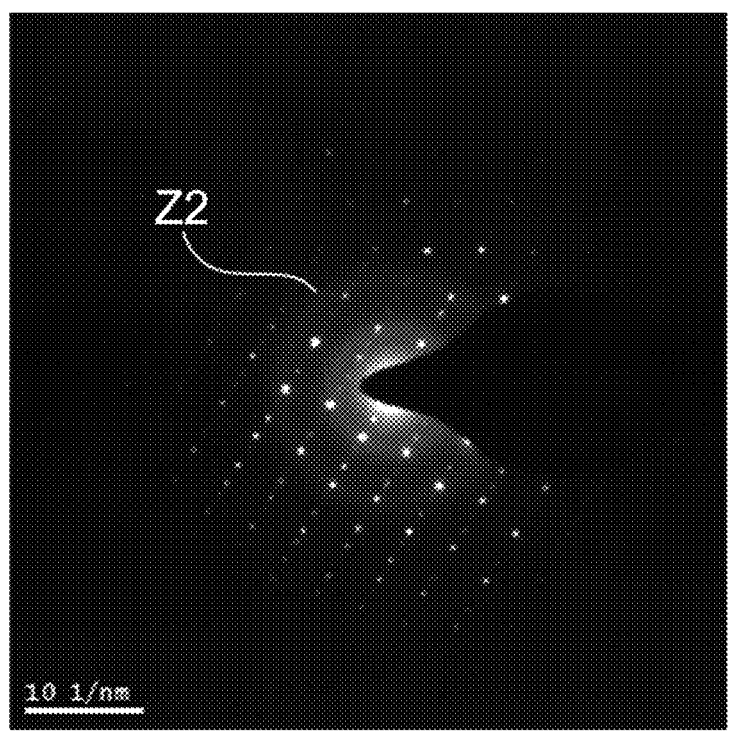
Figure 11D:
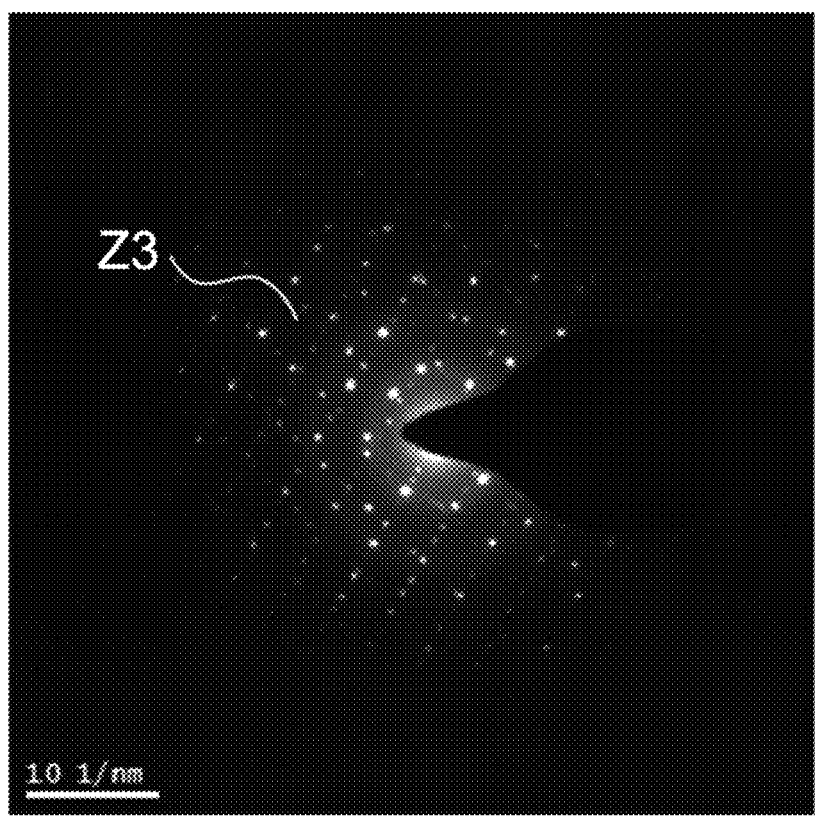

FIG. 11B is a crystal orientation Z1 of the first metallic nano wire A1 and FIG. 11C is a crystal direction Z2 of the second metallic nano wire A2. FIG. 11D is a direction Z3 of the junction V. It can be seen that the crystal orientation Z3 of the junction V may include both the crystal orientation Z1 of the first metallic nano wire and the crystal orientation Z2 of the second metallic nano wire. This means that strong bonding is achieved while the crystal structure of the metallic nano wires is being maintained.

Figure 12:
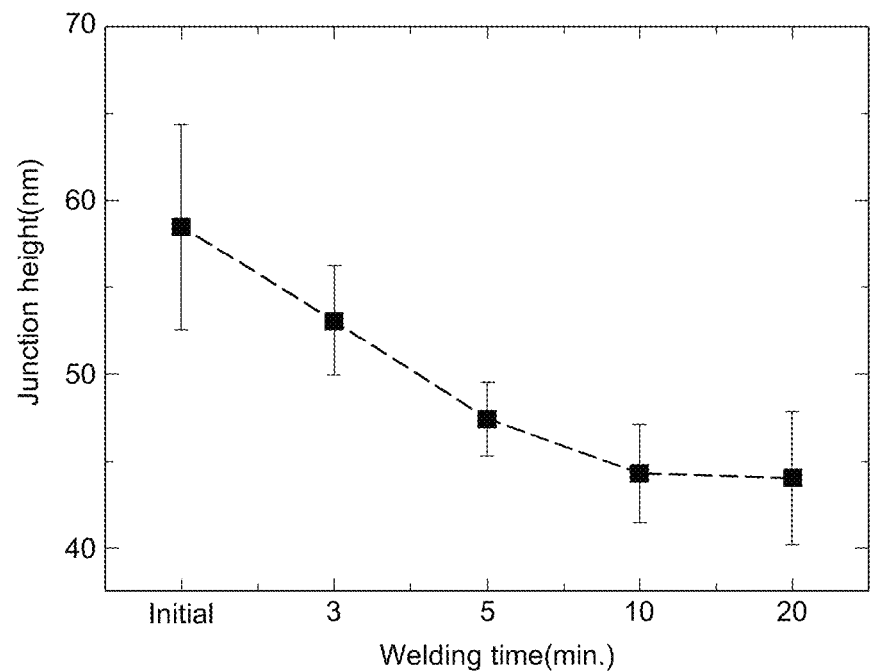
FIG. 12 is a graph showing changes in the height of a junction of a metallic nano wire network according to progress of welding and sintering according to an embodiment of the present invention.

FIG. 12 is a graph illustrating a change in height of a junction of the silver nano wires according to the sintering time of the silver nano wires.

Referring to FIG. 12, the height of the junction of the silver nano wires decreases gradually to about 10 minutes of sintering, but when the sintering is performed for a long time (20 to 30 minutes), the height of the junction is no longer reduced. It can be seen that condensation by the corrosive vapor at the junction may occur not only at the junction but also at all locations of the silver nano wire. Here, the reduction of the joint height means the progress of sintering.

Figure 13:
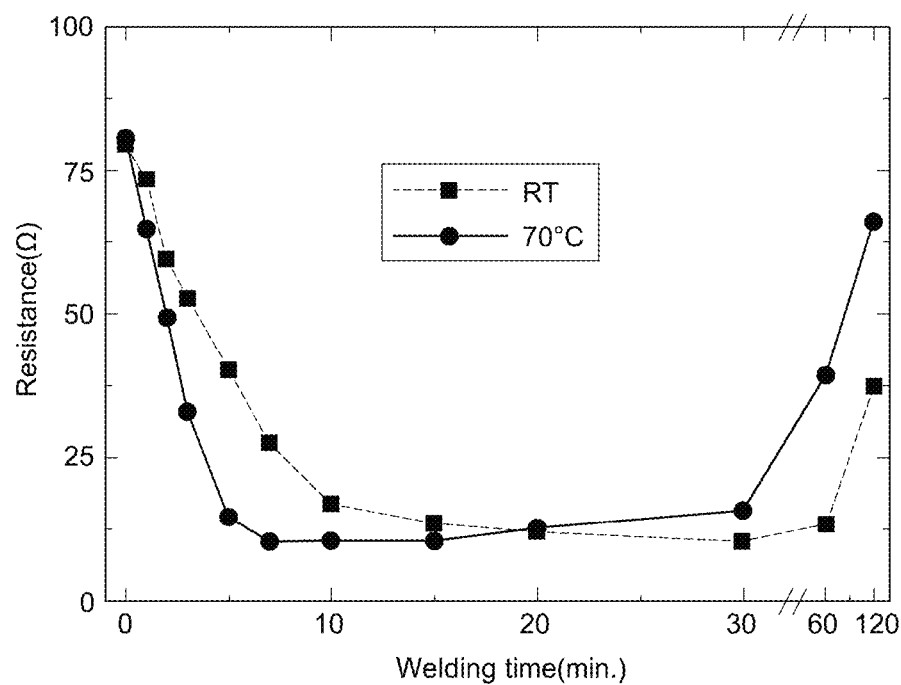
FIG. 13 is a graph showing change of a resistance value of a metallic nano wire network when the welding time and the sintering time according to an embodiment of the present invention are progressing.

FIG. 13 is a graph showing changes in resistance value of the silver nano wire network according to the time at which sintering is processed at room temperature RT and 70° C.

Referring to FIG. 13, the minimum value appears at about 30 minutes at room temperature and about 5 minutes at 70° C., depending on the sintering time. As the sintering time increases, the resistance begins to increase again. It can be seen that the silver nano wires may be damaged or dissolution may be generated in other places except the junction due to increase of corrosive vapor.

Figure 14:
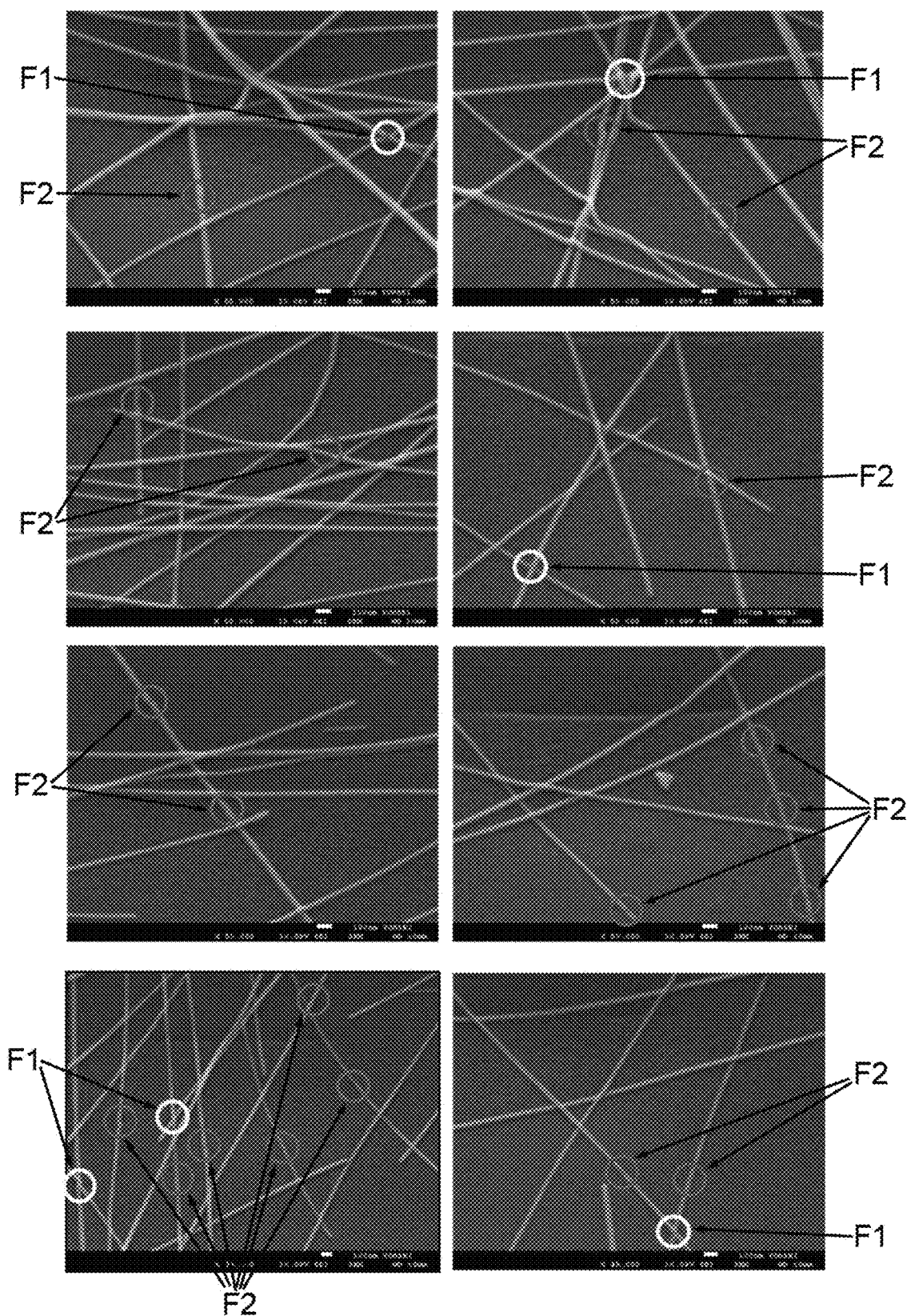
FIG. 14 is SEM images showing the crack of a bonded metallic nano wire network junction and the crack of a unbonded metallic nano wire network surface when a tensile force is applied after exposing the metallic nano wire network to corrosive vapor in accordance with an embodiment of the present invention.

FIG. 14 is the scanning electron microscope images illustrating cracks F1 of the bonded metal nano wire network junctions and cracks F2 of the unbonded metallic nano wire network surfaces when applying a tensile strain of about 10% to a bonded silver nano wire network according to one embodiment of the present invention. This means that the junction of the above-described metallic nano materials may bond the metallic nano materials very locally and strongly.

Figure 15A:
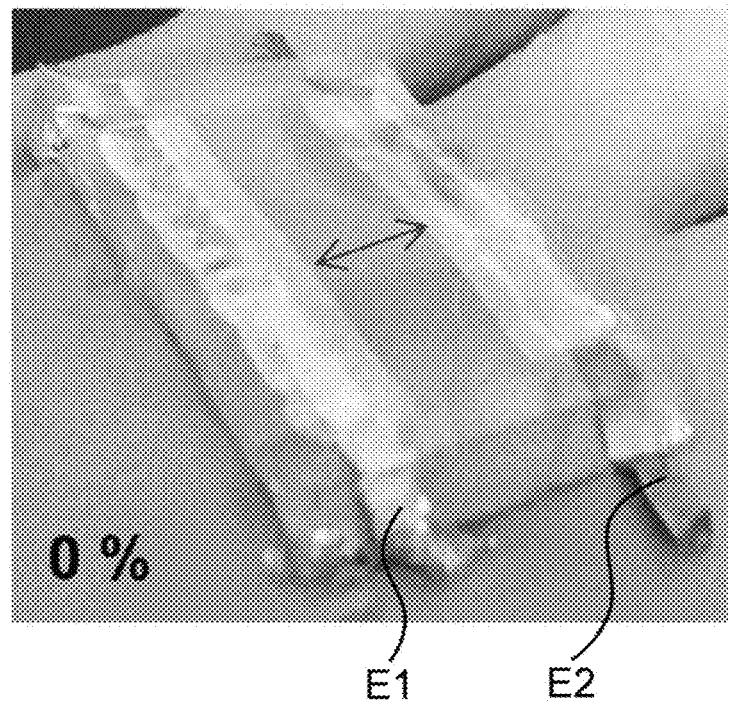
FIG. 15A is an image of a heater including a first electrode and a second electrode spaced apart from each other on a bonded metallic nano wire network layer according to an embodiment of the present invention.

FIG. 15A is an image showing a heater that is one of the electrical devices including the metallic nano structure according to one embodiment of the present invention disposed on a substrate. The heater is formed in a structure in which a flexible substrate is used as a material of the substrate and a first electrode and a second electrode are disposed apart from each other on the metallic nano structure layer, but the present invention is not limited thereto.

The electrical device includes any one selected from an electrode, a light source, a photoelectric cell, a strain sensor, a tactile sensor, a proximity sensor, and a touch sensor, or a combination thereof, but these are only the examples, and the present invention is not limited thereto.

Figure 15B:
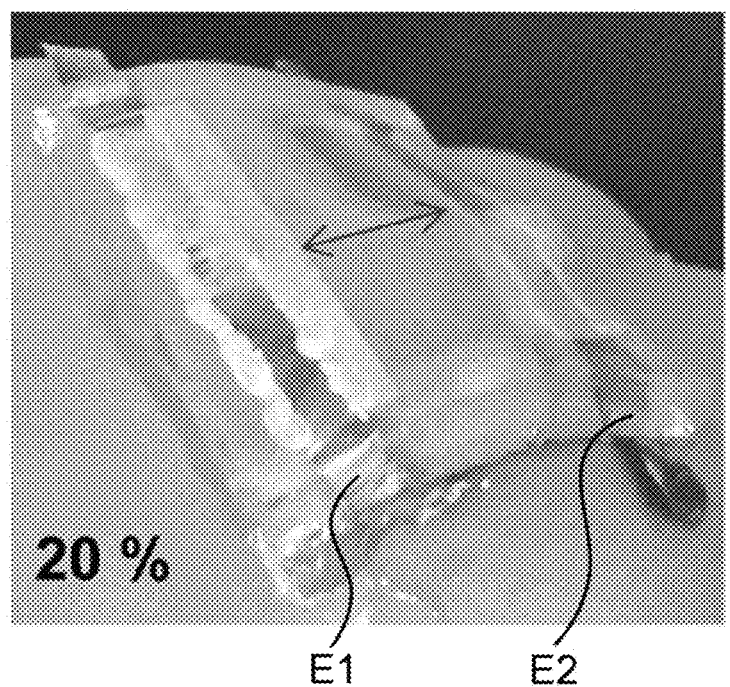
FIG. 15B is an image showing a state when a tensile force is applied to the heater.

FIG. 15B is an image obtained by applying a tensile strain of 20% to the heater. Since the flexible substrate is used as the material of the substrate, it is possible to make a flexible bending possible in the case of tensile deformation.

Figure 16A:
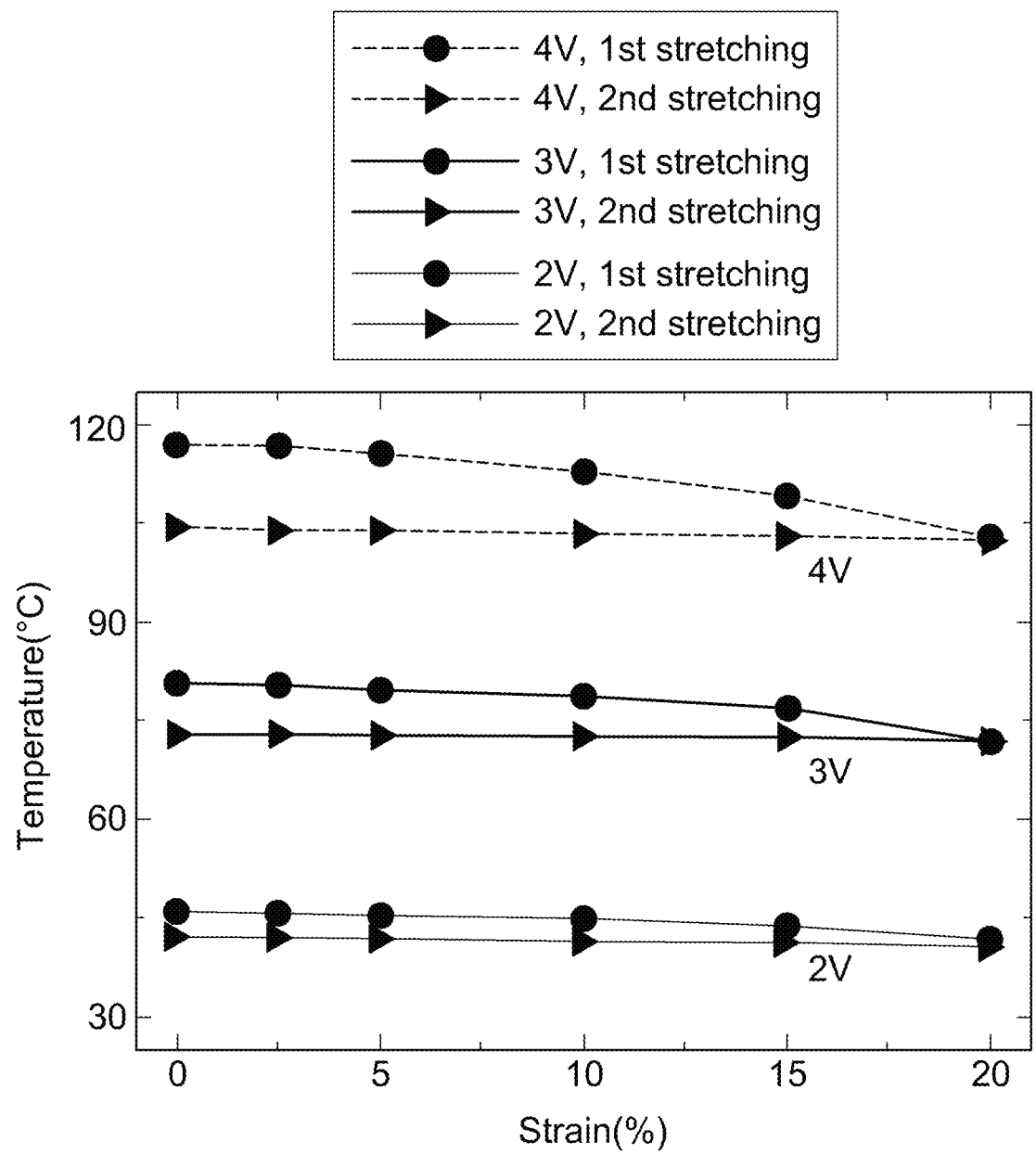
FIG. 16A is a graph showing a temperature change appeared when a tensile force is applied to a heater including a first electrode and a second electrode spaced apart from each other on a bonded metallic nano wire network layer according to an embodiment of the present invention.

FIG. 16A is a graph illustrating a change in temperature due to tensile change of a heater including a first electrode and a second electrode spaced apart from each other on a bonded silver nano wire network layer according to an embodiment of the present invention. The temperature of the heater showed a slight hysteresis at the first tensile, and it showed a stable and constant temperature according to the tensile cycle. This means that it is possible to provide a reliable electrical device by providing the electrical devices including the bonded metallic nano structure such as the heater. Due to the high electrical conductivity of the bonded silver nano particles, the temperature rises above 100° C. under 4 V bias.

Figure 16B:
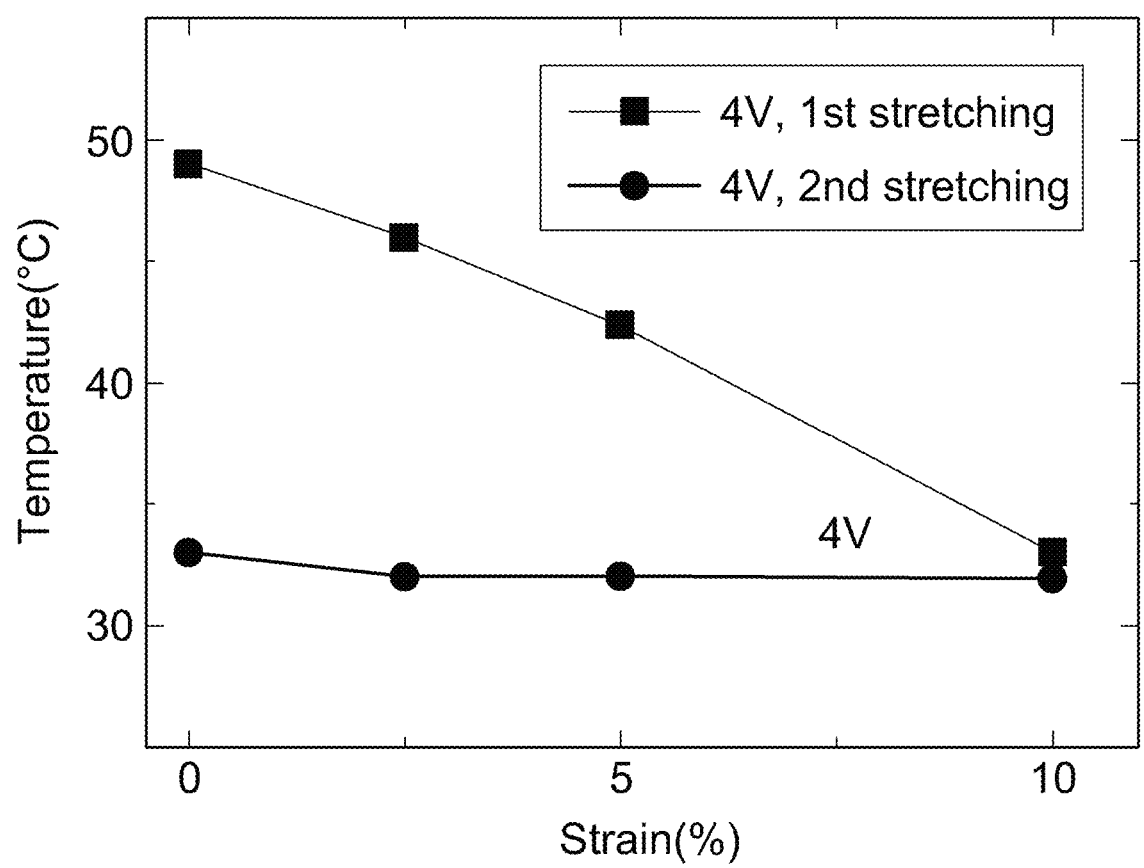
FIG. 16B is a graph showing temperature changes when a tensile force is applied to a heater including a first electrode and a second electrode which are disposed spaced apart from each other on a unbonded metallic nano wire network layer.

FIG. 16B is a graph showing a change in temperature when a tensile force is applied to a heater including a first electrode and a second electrode spaced apart from each other on a silver nano wire network layer that is not bonded. A heater comprising a first electrode and a second electrode spaced apart from each other on the unbonded silver nano wire network layer reached about 50° C. at 4V and also exhibited somewhat greater hysteresis. It is to be understood that the main reason of it is that the electrical conductivity of the non-welded network is low, and it can be seen that the unbonded nano wire network exhibits inferior performance as compared to the bonded silver nano wire network described in FIG. 16A. Therefore, various reliable electrical devices may be realized by using the metallic nano structure disposed on a substrate according to one embodiment of the present invention.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A metallic nano structure comprising:
   a plurality of metallic nano materials; and
   a bonding junction localized between at least two metallic nano materials in direct contact with each other,
      wherein the bonding junction bonds the at least two metallic nano materials,
      wherein the bonding junction between the at least two metallic nano materials includes a locally condensed corrosive vapor-induced resolidified surface of the at least two metallic nano materials, and the resolidified surface is only localized between the at least two metallic nano materials by capillary condensation.

2. The metallic nano structure of claim 1, wherein the plurality of metallic nano materials have a crystal structure, and the junction has the crystal structure.

3. The metallic nano structure of claim 2, wherein the crystal structure of the junction includes both of a crystal orientation of a first metallic nano material and a crystal orientation of a second metallic nano material among the metallic nano materials adjacent to each other.

4. The metallic nano structure of claim 1, wherein the junction comprises a part of surfaces of the first metallic nano material and a part of surfaces of the second metallic nano material among the metallic nano materials adjacent to each other.

5. The metallic nano structure of claim 1, wherein the metallic nano materials include metallic nano wires, metallic nano particles, metallic nano rods, metallic nano discs, metallic nano patterns, metallic nano blocks, metal fibers and metal filaments, or combinations thereof.

6. The metallic nano structure of claim 1, wherein a part of the metallic nano materials adjacent to each other cross each other in order to form a nano gap.

7. The metallic nano structure of claim 1, further comprising a flexible polymer substrate providing a surface on which the plurality of metallic nano materials are disposed.

8. An electrical device comprising:
   a substrate; and
   a metallic nano structure comprising:
      a plurality of metallic nano materials; and
      a bonding junction localized between at least two metallic nano materials in direct contact with each other, wherein the bonding junction bonds the at least two metallic nano materials,
      wherein the bonding junction between the at least two metallic nano materials includes a locally condensed corrosive vapor-induced resolidified surface of the at least two metallic nano materials, and the resolidified surface is only localized between the at least two metallic nano materials by capillary condensation.

9. The electrical device of claim 8, wherein the electrical device includes any one of an electrode using the metallic nano structure, a photoelectrical cell, a sensor, and a heater.

10. The electrical device of claim 9, wherein the heater is formed as a structure in which a first electrode and a second electrode are disposed apart from each other on the metallic nano structure.

11. The electrical device of claim 8, wherein the plurality of metallic nano materials have a crystal structure, and the junction has the crystal structure.

12. The electrical device of claim 11, wherein the crystal structure of the junction includes both of a crystal orientation of a first metallic nano material and a crystal orientation of a second metallic nano material among the metallic nano materials adjacent to each other.

13. The electrical device of claim 8, wherein the junction comprises a part of surfaces of the first metallic nano material and a part of surfaces of the second metallic nano material among the metallic nano materials adjacent to each other.

14. The electrical device of claim 8, wherein a part of the metallic nano materials adjacent to each other cross each other in order to form a nano gap.

15. The electrical device of claim 8, wherein the metallic nano materials include metallic nano wires, metallic nano particles, metallic nano rods, metallic nano discs, metallic nano patterns, metallic nano blocks, metal fibers and metal filaments, or combinations thereof.

16. The electrical device of claim 8, wherein the metallic nano structure further comprising a flexible polymer substrate providing a surface on which the plurality of metallic nano materials are disposed.

* * * * *